United States Patent
Tayanaka

(10) Patent No.: US 7,626,200 B2
(45) Date of Patent: Dec. 1, 2009

(54) PROCESS FOR FABRICATING A THIN FILM SEMICONDUCTOR DEVICE, THIN FILM SEMICONDUCTOR DEVICE, AND LIQUID CRYSTAL DISPLAY

(75) Inventor: Hiroshi Tayanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 702 days.

(21) Appl. No.: 10/939,437

(22) Filed: Sep. 14, 2004

(65) Prior Publication Data
US 2005/0059219 A1    Mar. 17, 2005

(30) Foreign Application Priority Data
Sep. 17, 2003   (JP) .............................. 2003-323871

(51) Int. Cl.
*H01L 31/00* (2006.01)
(52) U.S. Cl. .............................. 257/59; 257/72; 257/350
(58) Field of Classification Search .................. 257/59, 257/72, 350
See application file for complete search history.

(56) References Cited

U.S. PATENT DOCUMENTS

| | | | | |
|---|---|---|---|---|
| 5,633,182 | A | * | 5/1997 | Miyawaki et al. ............. 438/30 |
| 6,127,199 | A | * | 10/2000 | Inoue et al. .................... 438/30 |
| 6,667,517 | B1 | * | 12/2003 | Yamazaki ...................... 257/347 |
| 6,803,264 | B2 | * | 10/2004 | Yamazaki et al. ............. 438/151 |
| 6,891,578 | B2 | * | 5/2005 | Yonehara et al. .............. 349/43 |

FOREIGN PATENT DOCUMENTS

| | | |
|---|---|---|
| JP | 64-053459 | 1/1989 |
| JP | 64-059866 | 3/1989 |
| JP | 05-257171 | 10/1993 |
| JP | 09-312349 | 12/1997 |
| JP | 09-312349 A | 12/1997 |
| JP | 10-125881 | 5/1998 |
| JP | 10-190029 | 7/1998 |
| JP | 2000-196093 | 7/2000 |
| JP | 2001-237403 | 8/2001 |

OTHER PUBLICATIONS

Japanese Office Action 2003-323871 issued on Feb. 6, 2007.
Japanese Office Action issued on Jul. 3, 2007 in JP2003-323871.

* cited by examiner

*Primary Examiner*—Mark Prenty
(74) *Attorney, Agent, or Firm*—Rader, Fishman & Grauer PLLC

(57) ABSTRACT

A process of fabricating a thin film semiconductor device is proposed, which is suitable for mass production and enables to lower the production cost. A first substrate is subject to anodization to form a porous layer thereon. Then, a thin film semiconductor layer is formed on the porous layer. Using the thin film semiconductor layer, a semiconductor device is formed, and wiring is formed between the semiconductor devices. After that, the semiconductor devices on the first substrate is bonded to a second substrate. The semiconductor devices are separated from the first substrate. Further, the semiconductor devices are electrically insulated by removing a part of the thin film semiconductor layer from the separated surface of the second substrate.

10 Claims, 34 Drawing Sheets

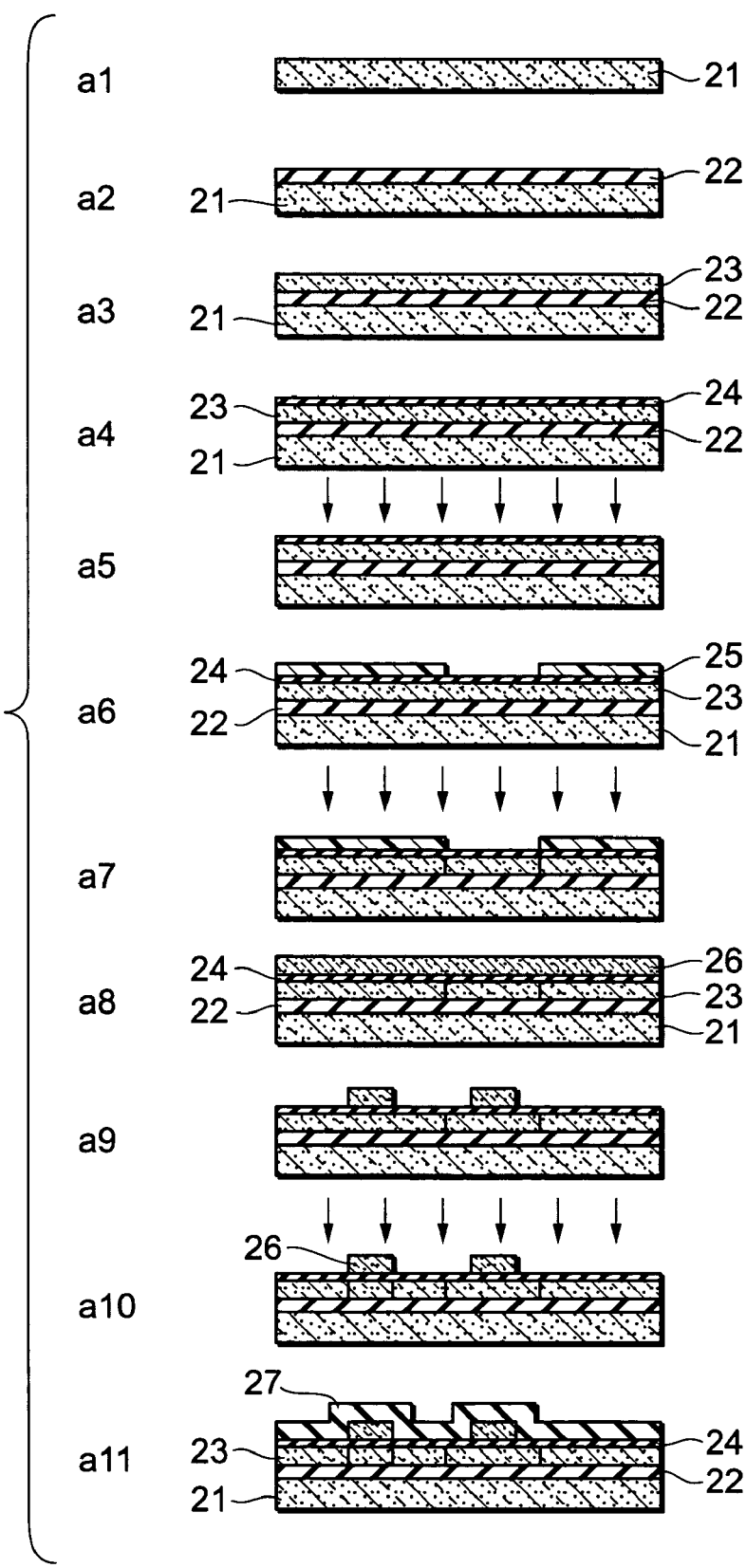

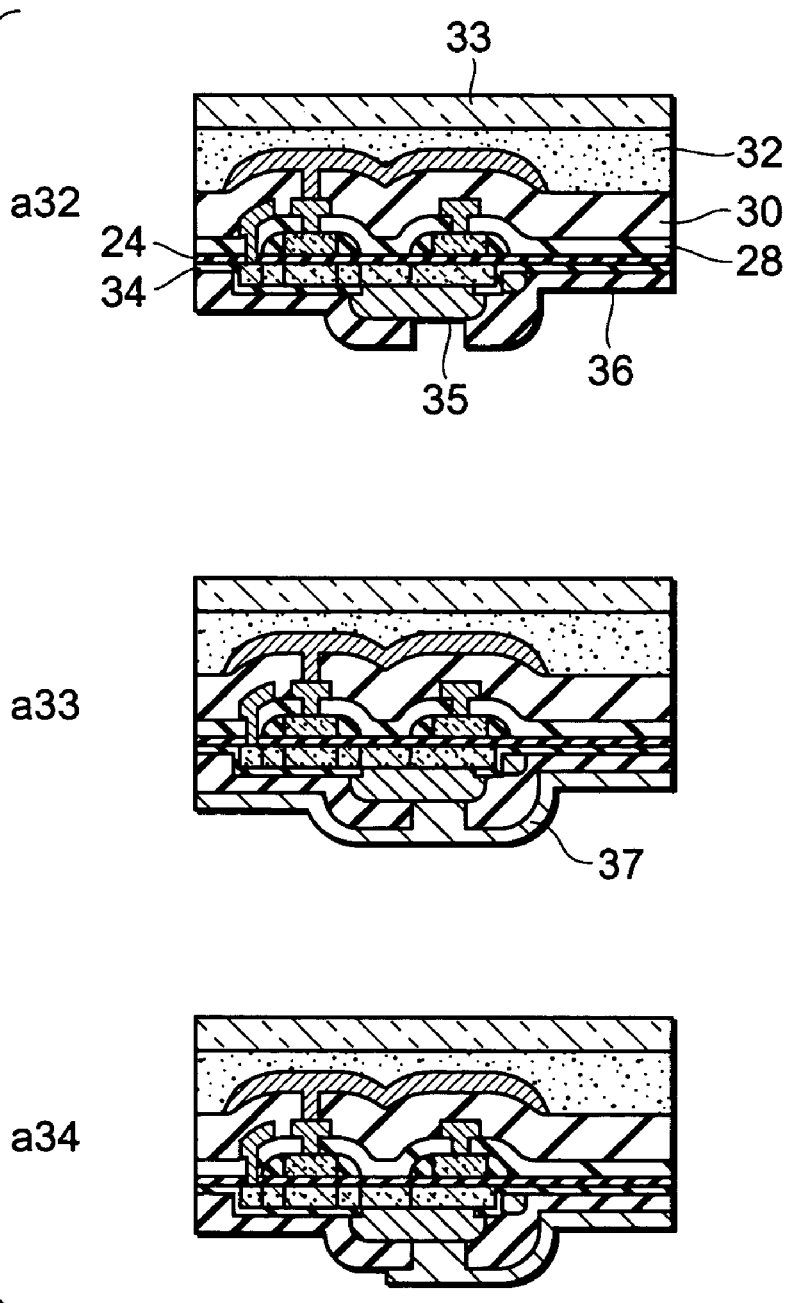

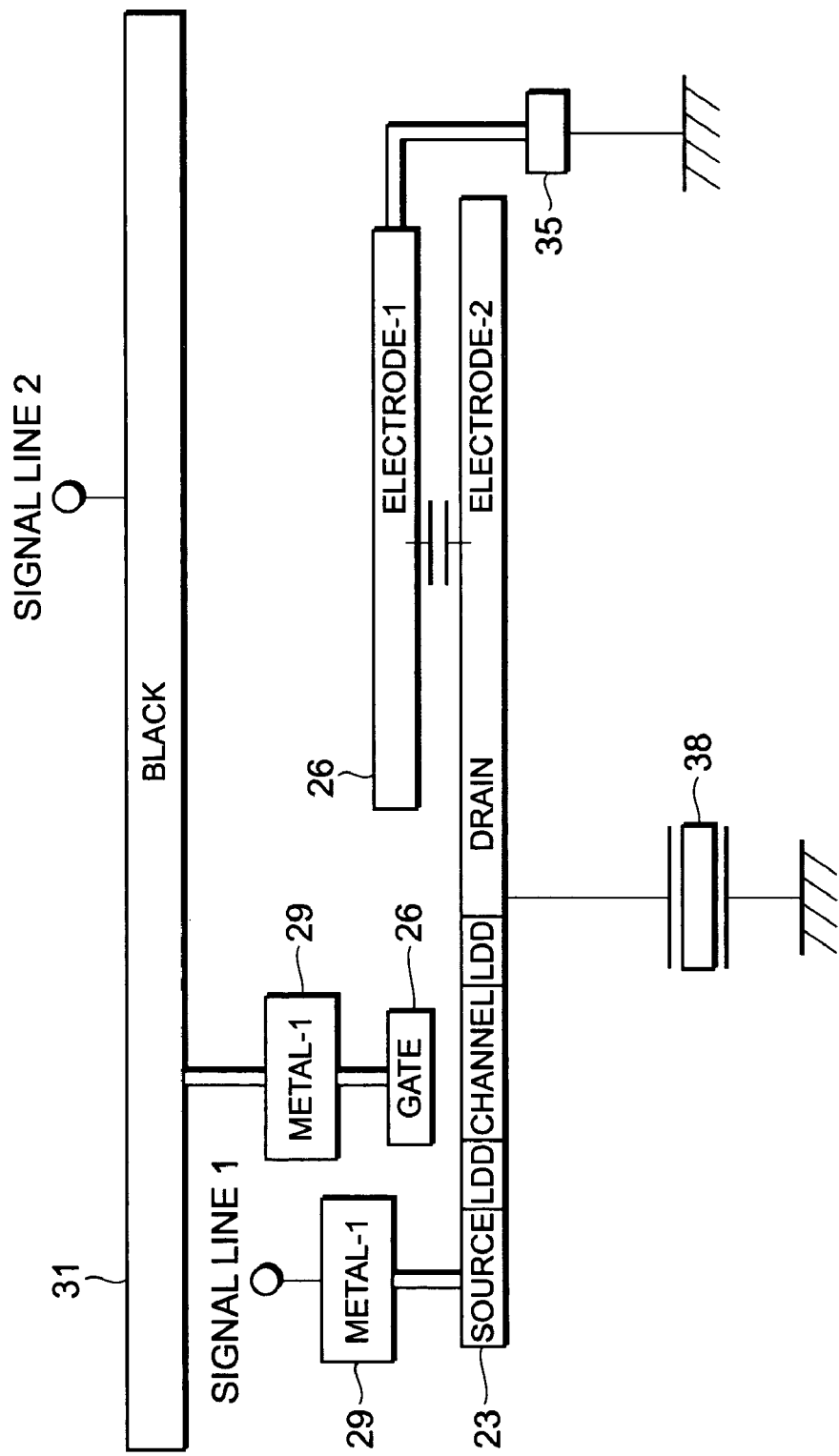

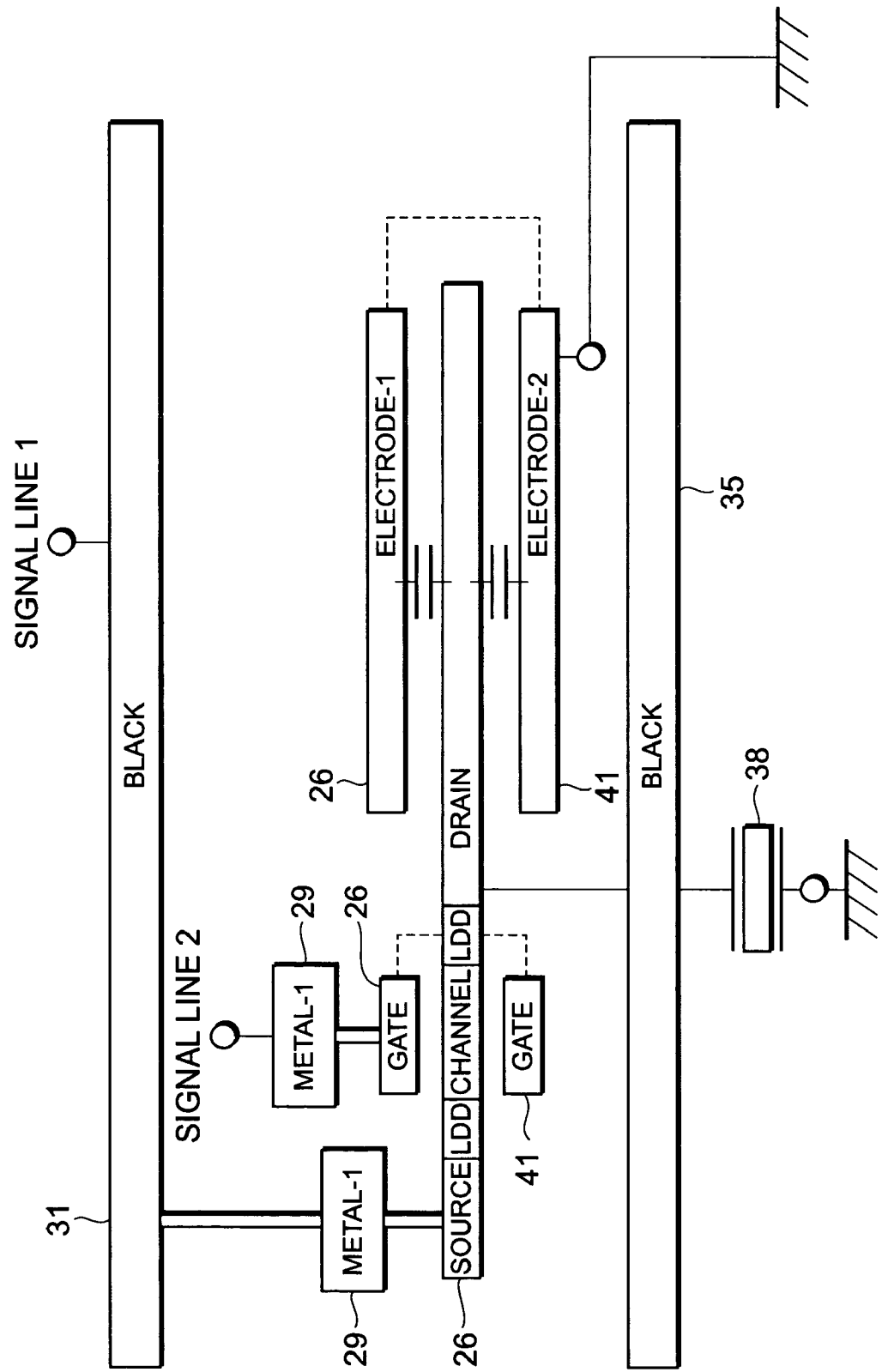

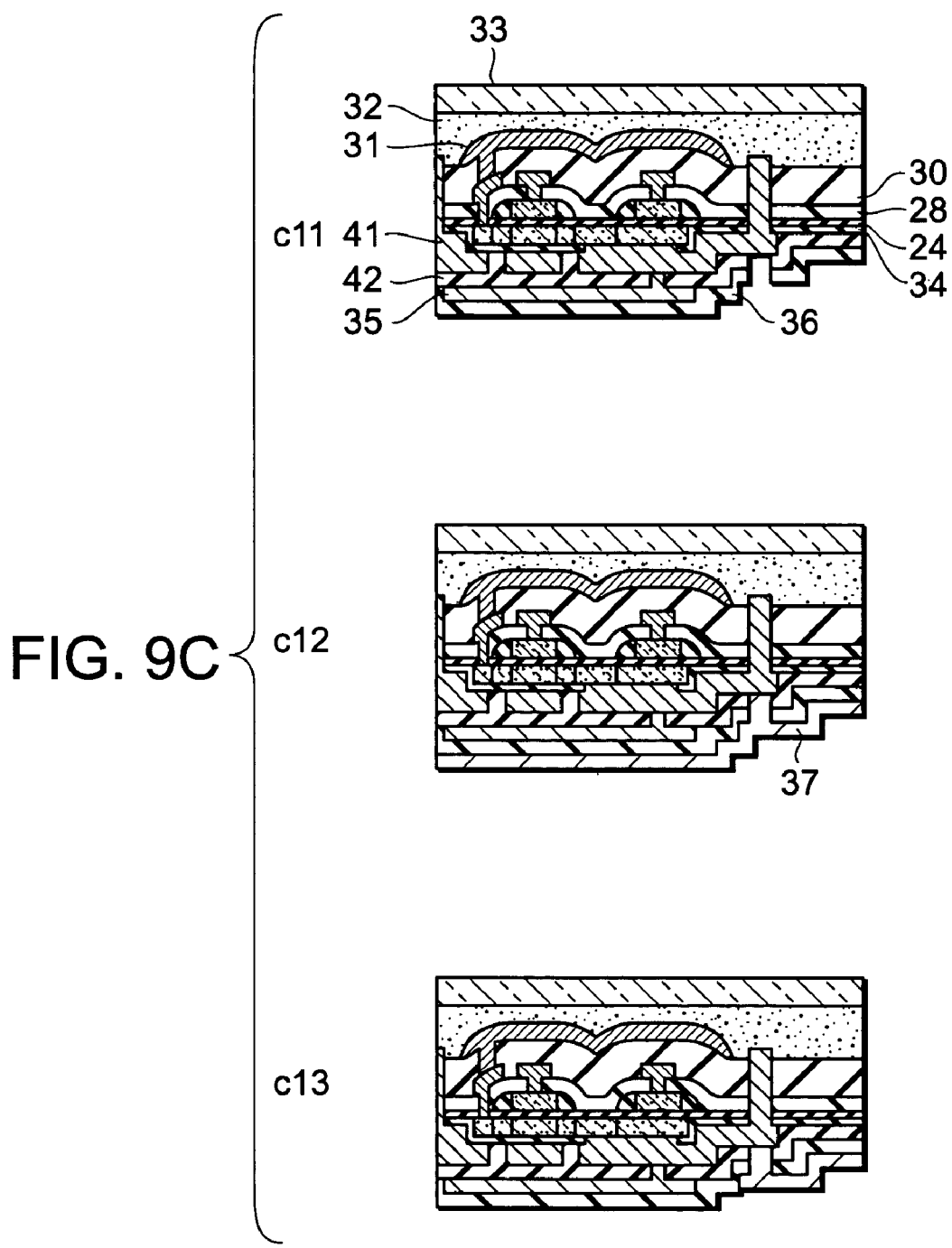

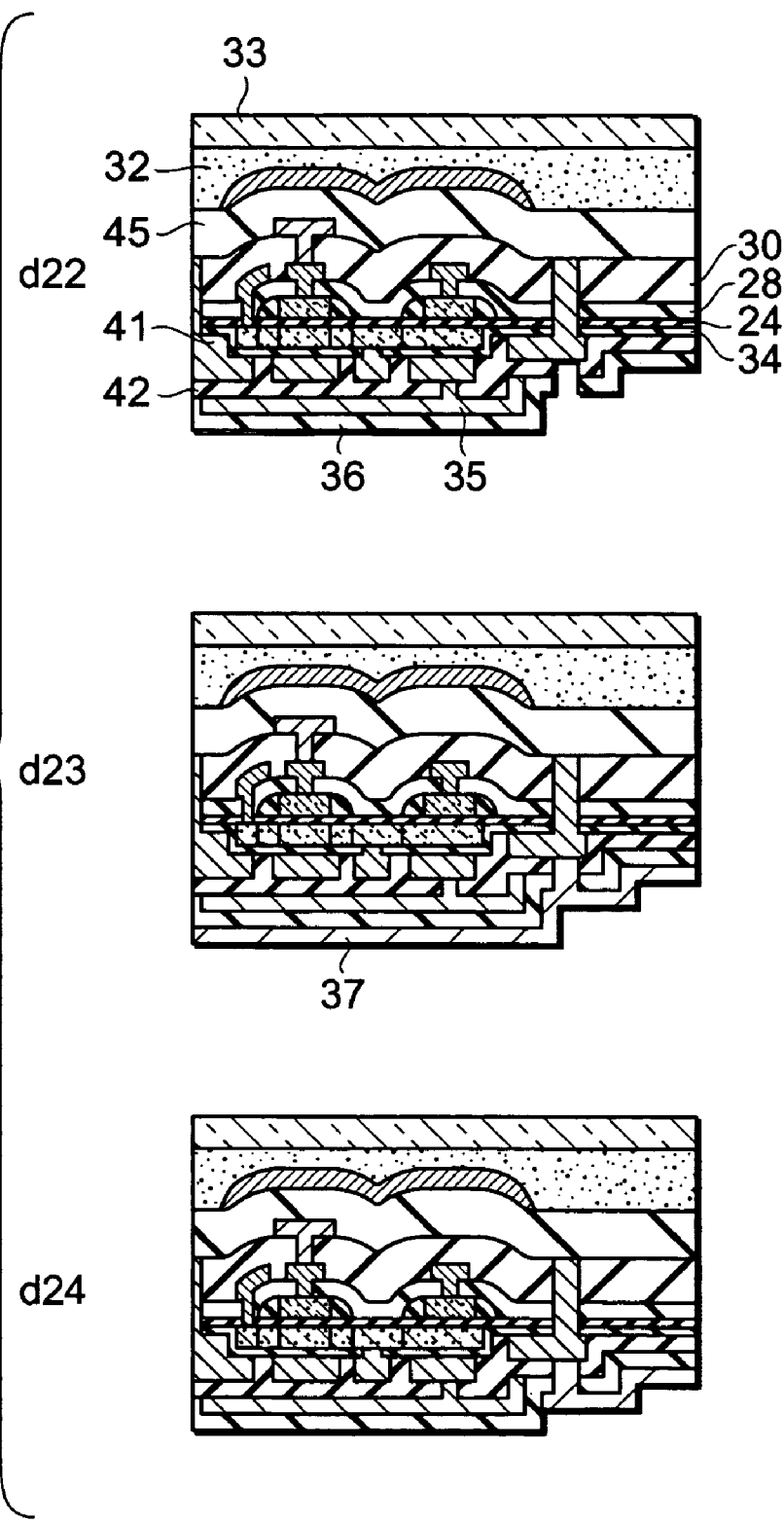

PROCESS FOR FABRICATING A THIN FILM SEMICONDUCTOR DEVICE, THIN FILM SEMICONDUCTOR DEVICE, AND LIQUID CRYSTAL DISPLAY

CROSS REFERENCE TO RELATED APPLICATION

This application claims priority from Japanese Priority Application No. 2003-323871, filed on Sep. 17, 2003 with the Japanese Patent Office, the entire content of which is hereby incorporated by reference.

BACKGROUND OF THE INVENTION

1. Field of the Invention

The present invention relates to a process for fabricating a thin film semiconductor device. In addition, the present invention is concerned with a thin film semiconductor device produced using the process and an apparatus having mounted the thin film semiconductor device.

2. Description of Related Art

Currently, in a TFT (thin film transistor) for use in transmissive LCD (liquid crystal display), polysilicon or amorphous silicon is mainly used. A TFT using thin film single-crystalline silicon as a material has excellent properties such that the current driving ability is high, a variation of the threshold voltage Vth is small, and the like. As a method for producing the TFT, for example, a method in which a transistor and an isolation region are formed on an SOI (silicon on insulator) substrate and an insulating film is etched using hydrofluoric acid for lift-off has been proposed. For, example, please refer to the following document.

Japanese Patent Application Publication No. Hei 9-312349

In addition, currently, as a transistor having a structure for improving the current driving ability, a double gate thin film single-crystalline silicon transistor is being developed. The transistor having this structure can be produced by, for example, a bonding method. This production method has a feature such that a back gate is preliminarily incorporated into a laminate substrate to form an SOI substrate. However, this transistor has technical problems in that self-alignment cannot be achieved and the production cost is increased.

In the above problems, with respect to the self-alignment structure, for example, IBM has proposed a method called a Fin FET Structure method. This production method has a feature such that a gate is etched from the side of an SOI layer which is vertical. This method enables the gate lengths on both sides to be completely equal to each other, so that a double gate transistor having ideal electrical properties can be produced.

However, any methods have a problem in that the production cost is high. Further, the production methods mentioned above also have a problem concerning mass production.

SUMMARY OF THE INVENTION

In view of the above problems, the present invention has been made and a task is to solve one or more of the above problems.

The present invention is characterized in that a semiconductor device is formed using a thin film semiconductor layer formed on a porous layer as a base, and stacked on another substrate, (namely, after the semi-packaging step) followed by processing in which part of the thin film semiconductor layer is removed from the separated surface of the another substrate. Further, the present invention is characterized in that a semiconductor device is further formed on the separated surface so that the thin film semiconductor layer has semiconductor devices on the both surfaces.

Further features of the invention, and the advantages offered thereby, are explained in detail hereinafter, in reference to specific embodiments of the invention illustrated in the accompanying drawings.

BRIEF DESCRIPTION OF THE DRAWINGS

FIGS. 5A to 5F are views showing a fabrication process according to the first embodiment.

FIG. 6 is a view showing the diagrammatic cross-sectional structure of a liquid crystal display produced in the first embodiment.

FIG. 8 is a view showing the diagrammatic cross-sectional structure of a liquid crystal display produced in the second embodiment.

FIGS. 9A to 9D are views showing a fabrication process according to the third embodiment.

FIGS. 11A to 11F are views showing a fabrication process according to the fourth embodiment.

DESCRIPTION OF THE PREFERRED EMBODIMENTS (a) Basic Process

Figure 1:
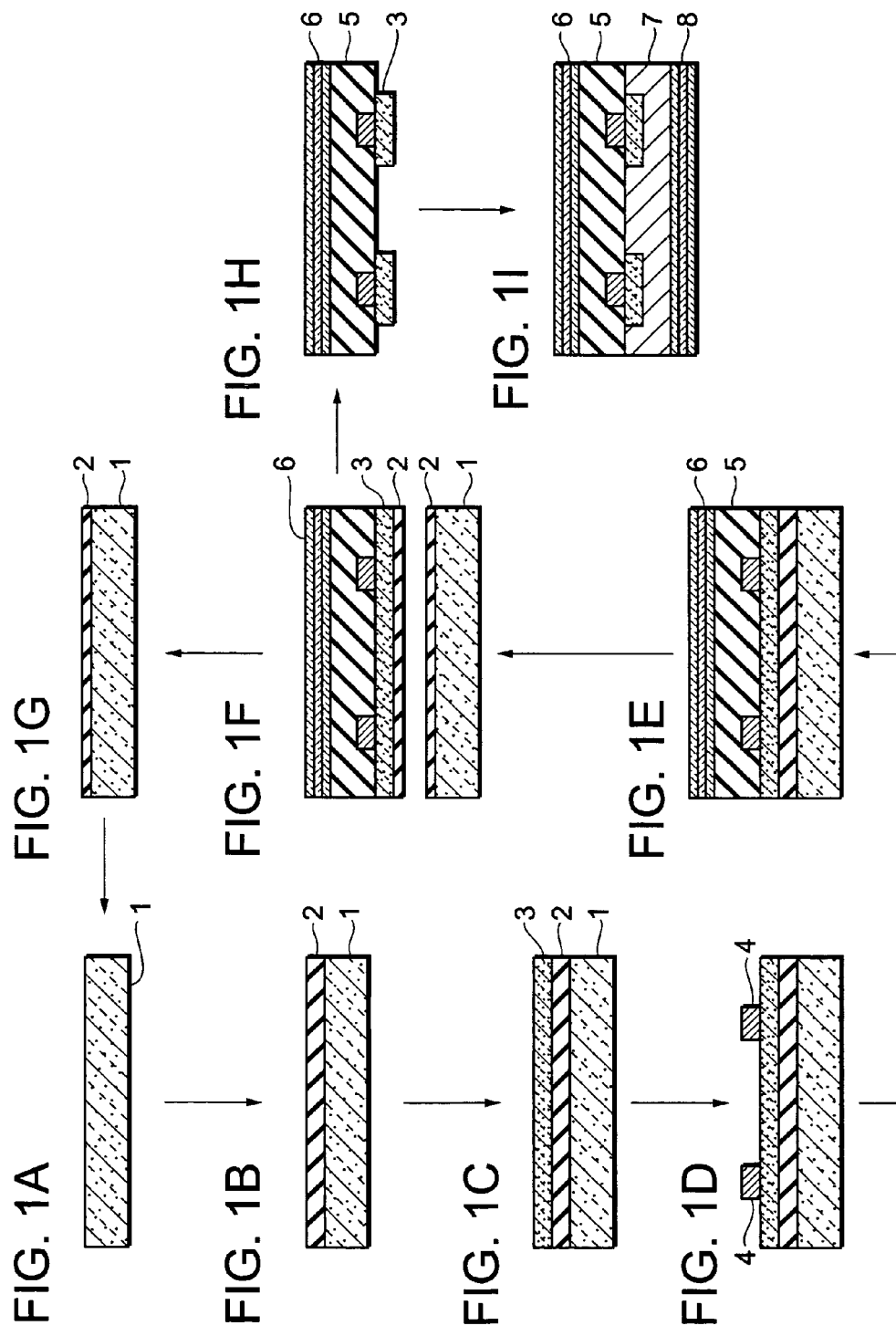
FIGS. 1A to 1I are views showing one example of the basic process in the present invention.

FIGS. 1A to 1I show the basic process of a process for fabricating a thin film semiconductor device. First, a substrate 1 in FIG. 1A is subjected to anodization. The anodization is to allow a current to flow using a substrate (e.g., silicon wafer) as an anode (+) and a counter electrode (e.g., platinum) as a cathode (−) to form an anodized film on the substrate 1. As conditions for the anodization (current density, electrolytic solution concentration, anodization time), those used in a known technique are used.

Thus, as shown in FIG. 1B, a porous layer (anodized film) 2 is formed on the surface of the substrate. The porous layer has formed therein a great number of extremely small pores having a diameter of, for example, 0.01 µm, namely, the layer has a so-called sponge structure. Next, as shown in FIG. 1C, a thin film semiconductor layer 3 is formed on the first substrate 1 using the porous layer 2 as a base. The porous layer 2 is used as a base, and therefore the thin film semiconductor layer 3 having very excellent crystalline properties can be allowed to grow.

Then, as shown in FIG. 1D, the resultant product is processed into a semiconductor device using the thin film semiconductor 3. FIG. 1D shows an example of processing into a TFT as a semiconductor device, in which gate electrodes 4 are formed on the upper surface of the thin film semiconductor layer 3 using a known semiconductor process. As mentioned below, the semiconductor device is not limited to a TFT.

Subsequently, wiring is formed between the semiconductor device formed and another semiconductor device. Then, as shown in FIG. 1E, an insulating film 5 having a function similar to that of a bonding agent or a joint agent is applied or stacked onto the exposed surface to bond or join the semiconductor device to a second substrate 6.

Next, as shown in FIG. 1F, the semiconductor device bonded or joined to the second substrate 6 is separated from the first substrate 1. The separation is made at the porous layer 2. For example, the separation is conducted using a method by mechanical breakage, in which an external force is exerted on the side of the porous layer 2 to form a notch and the notch is expanded. Alternatively, for example, the separation is conducted by cutting the porous layer 2 using an ultra-high pressure water stream (water jet).

FIG. 1G shows a cross-sectional layer structure of the first substrate separated. The porous layer 2 remains on the substrate 1, but the porous layer 2 is removed. The porous layer 2 is removed and then the substrate 1 is reused in the next fabrication process as shown in FIG. 1A. The substrate 1 can be reused in this way, enabling lowering of the production cost.

On the other hand, FIG. 1H shows a cross-sectional layer structure of the second substrate to which the semiconductor device is transferred. In this step, a step for removing the remaining porous layer 2 from the separated surface and partially removing the exposed thin film semiconductor layer 3 is carried out. By this step, the semiconductor device is electrically insulated from another semiconductor device. Processing the thin film semiconductor layer 3 in this stage can realize a high processing accuracy.

In the stage shown in FIG. 1D, the thin film semiconductor layer 3 can be partially removed. In this case, at least two regions comprised of different materials for films are formed on the porous layer 2 in the subsequent step. However, the difference in the materials for films is likely to cause a damage, e.g., the thin film semiconductor layer 3 is peeled off during the removal of the porous layer 2, leading to an increase of the production cost. For this reason, in the present invention, the thin film semiconductor layer 3 is processed in the stage shown in FIG. 1H.

In the stage shown in FIG. 1H, it is preferred that the porous layer 2 is completely removed. However, the porous layer 2 may remain on part of or the entire surface of the substrate as long as the operation performance of the semiconductor device is not sacrificed.

Subsequently, a step for forming an insulator on the separated surface is carried out. Described above is the basic process. By using the process, for example, processing can be achieved in which a thin film semiconductor is allowed to undergo epitaxial growth on a porous semiconductor, which has been formed by subjecting the surface of a semiconductor substrate to anodization, to form a semiconductor device, and the semiconductor device is separated and transferred to another substrate.

According to the semiconductor device to be produced, as a step subsequent to this step, a step for partially removing the insulator on the separated surface to expose part of the semiconductor device may be performed. In this case, subsequently, for example, a step for forming a conductive material on the exposed part of the semiconductor device to make electrical conduction between the conductive material and the semiconductor device is carried out.

FIG. 1I shows a step conducted when the basic process is applied to a process for producing an LCD, which step is subsequent to the above-described formation of wiring, and indicates a state in which a liquid crystal 7 on the semiconductor device is sealed with a glass substrate 8 after the step for wiring. In this production process for LCD, as the above-mentioned second substrate 6, a glass substrate is used.

Further, with respect to the basic fabrication process described above, a process further comprising a step for forming a light-shielding layer is proposed. Two types of processes further comprising the step are proposed. The first one is a process further comprising the step at a stage of FIG. 1D. For example, after forming a wiring between the semiconductor device formed and another semiconductor device, and before bonding or joining the semiconductor device to the second substrate 6, a step for forming a light-shielding layer on the wiring may be provided.

Another one is a process further comprising the step at a stage of FIG. 1H. For example, after the step for forming a conductive material on the exposed part of the semiconductor device to make electrical conduction between the conductive material and the semiconductor device, a step for forming a light-shielding layer on the separated surface may be provided. By providing a step for forming a light-shielding layer, a semiconductor device, such as a TFT, can be completely shielded from light. Therefore, the above-mentioned basic process can be applied to the process for fabricating a semiconductor device which needs to prevent a malfunction due to light irradiation.

In each step in the above process, the materials and conditions mentioned below can be further used. For example, as the first substrate, it is preferred to use a single-crystalline semiconductor material. A polycrystalline semiconductor material can also be used. Alternatively, in the first substrate, an elementary semiconductor or a compound semiconductor may be used as a semiconductor material.

As an elementary semiconductor, for example, silicon (Si) or germanium (Ge) can be used. As a compound semiconductor, for example, a IV-IV Group compound semiconductor or a III-V Group compound semiconductor can be used. Specifically, a compound of silicon and germanium, a compound of gallium and arsenic, a compound of gallium and phosphorus, a compound of gallium, indium, and phosphorus, or a compound of gallium and nitrogen can be used.

Further, as the thin film semiconductor layer, it is preferred to use a single-crystalline semiconductor material. For example, a thin film having excellent crystalline properties can be formed by allowing a single crystal to undergo epitaxial growth. A thin film having excellent crystalline properties can be used as mentioned above and therefore, for example, a TFT can be miniaturized. Further, in the thin film semiconductor layer, an elementary semiconductor or a compound semiconductor may be used as a semiconductor material.

As an elementary semiconductor, for example, silicon (Si) or germanium (Ge) can be used. As a compound semiconductor, for example, a IV-IV Group compound semiconductor or a III-V Group compound semiconductor can be used. Specifically, a compound of silicon and germanium, a compound of gallium and arsenic, a compound of gallium and phosphorus, a compound of gallium, indium, and phosphorus, or a compound of gallium and nitrogen can be used.

Further, it is desired that the thin film semiconductor layer has a thickness of several hundred angstroms to about 1 μm, further preferably the thin film semiconductor layer has a thickness of several nm to several hundred nm. When the thin film semiconductor layer has a thickness in the above range, the parasitic capacitance can be further reduced, so that an increase of the speed and a lowering of the power consumption can be realized. Basically, it is preferred that the thin film semiconductor layer is a film formed from the same material as that for the porous layer as a base, but the thin film semiconductor layer may be a film formed from a material different from the material for the porous layer as a base. For example, a thin film semiconductor layer comprised of a compound of gallium and arsenic can be allowed to undergo epitaxial growth on the porous silicon substrate. When the thin film semiconductor layer constitutes a portion of a transparent electrode, a charge coupled device (CCD) or CMOS (complementary MOS) sensor can be formed.

It is desired that the semiconductor device comprises any one of a MIS structure, a PN junction structure, a bipolar transistor structure, a laser oscillation structure, and a CCD structure. As the MIS structure, for example, a MOS (metal oxide semiconductor) structure is preferred. As the laser oscillation structure, for example, a double heterojunction structure is preferred. The CCD structure is a structure such that a number of electrodes of a MOS structure are arranged on the surface of a semiconductor. In the CCD structure, a charge is input by a signal toward an input portion, and a driving signal applied to each electrode transfers the input charge along the electrodes arranged, so that an operation taken out as a voltage from an output portion is made.

It is preferred that the semiconductor device comprises a MIS transistor. Further, it is more preferred that the semiconductor device comprises a MIS transistor of a double gate structure or part of the layer structure thereof. By using a TFT of a double gate structure, a thin film semiconductor device having a high driving ability can be produced. Further, it is desired that the semiconductor device comprises capacitors on both sides of the thin film semiconductor layer (i.e., a double-sided capacitor) or part of the layer structure thereof. The double-sided capacitor structure enables production of a TFT having a larger capacitance.

In the wiring, it is preferred to use a material containing any one of aluminum, tungsten, tungsten silicide, gold, silver, copper, platinum, and titanium. By using the above material in the wiring material like in a general MOS process, a thin film semiconductor device can be produced at a low cost. Further, in the bonding or joining step, it is preferred that bonding is achieved using a material having bonding properties placed between the thin film semiconductor layer and the second substrate. Further, in the bonding or joining step, joining may be performed by heating in a state in which the surface of the thin film semiconductor layer and the surface of the second substrate are in contact with each other.

As the second substrate, a transparent substrate or a substrate having flexibility, such as a plastic, can be used or a silicon substrate can be used. When the device is transferred to a transparent glass substrate, quartz substrate, or plastic substrate as the second substrate, the TFT can be produced on the transparent insulator substrate. Further, when the TFT is produced on the transparent insulator substrate, a liquid crystal panel can be assembled to produce an LCD comprising thin film single-crystalline silicon.

Specifically, the present invention can be applied to a process for producing a transmissive LCD. The silicon substrate separated can be reused repeatedly. In application of the present invention to transmissive LCD, when the TFT portion is irradiated with light, a malfunction occurs in the TFT, and therefore it is important that the TFT portion is prevented from being irradiated with light. In the present invention, the light-shielding layer is formed to completely shield the TFT portion from light as mentioned above, thus making easy application to the transmissive LCD.

Further preferably, the bonding or joining step may be conducted in a vacuum atmosphere. Further, it is desired that the step for partially removing the thin film semiconductor layer from the separated surface of the separated semiconductor device to electrically insulate the semiconductor device from another semiconductor device comprises a step for etching with a mask on the semiconductor device or a step for cutting the thin film semiconductor layer by laser irradiation. Thus, the steps similar to those used in a general MOS process can be used, and hence a thin film semiconductor device can be produced at a low cost.

In the step for forming an insulator on the separated surface, it is preferred that the insulator comprises a silicon compound as a material. As the silicon compound, it is preferred to use silicon dioxide which is a silicon oxide film or silicon nitride which is a silicon nitride film. By using these in the insulating film, an excellent thin film semiconductor device can be produced. Further, it is desired that the process further comprises a step for partially removing the insulator on the separated surface to expose part of the semiconductor device. In this case, it is preferred that this step comprises a step for etching with a mask on the semiconductor device or a step for cutting the insulator by laser irradiation.

Further, it is desired that the conductive material used for forming a conductive material on the exposed part of the semiconductor device is one which is optically transparent. The optically transparent material is preferably a material containing any one of a compound of indium, titanium, and oxygen, a compound of tin and oxygen, and a compound of zinc and oxygen.

Further, it is preferred that the conductive material used for forming a conductive material on the exposed part of the semiconductor device is a metal. In this case, as the metal, a material containing any one of aluminum, tungsten, gold, silver, copper, platinum, and titanium can be used. Similarly, in the light-shielding layer, it is desired that a material containing a metal is used. As the metal used in the light-shielding layer, it is desired that a material containing any one of aluminum, tungsten, gold, silver, copper, platinum, titanium, a compound of tungsten and silicon, and a compound of titanium and silicon is used.

In the present invention, a process before the separation and a process after the separation are combined to realize fabrication of a thin film semiconductor device, and hence processes having different temperature conditions can be used in combination. For example, in the process before separating the first substrate, a TFT can be produced using a high-temperature process. Therefore, for example, a heat diffusion furnace can be used, and thus a gate oxide film having excellent crystalline properties can be deposited by a high-temperature process. In addition, impurity diffusion in each device layer can be achieved without a temperature restriction.

On the other hand, after separating the first substrate, a TFT can be produced using a low-temperature process, although the temperature varies depending on the temperature resistance of the second substrate for transfer or the bonding material. For example, when glass is used in the substrate for transfer, a TFT can be produced at temperatures in the range lower than the temperature at which glass is melted. A production process similar to the low-temperature process used for large-size LCD panels can be employed.

As mentioned above, in the present invention, when the transparent electrode (ITO electrode) is changed to a metal, such as aluminum, silver, platinum, gold, palladium, magnesium, titanium, cobalt, or tungsten, a reflective LCD can be produced. In such a case, when the device is transferred to a substrate material for transfer (second substrate) having a high thermal conductivity, cooling of LCD can be facilitated. For example, the device may be transferred to a metal, such as aluminum or iron.

When a metal is used in the second substrate as a transfer substrate, the substrate is advantageously bonded using an insulating bonding agent, for example, the surface of the substrate is coated with an insulating film or an insulating film is attached to the substrate. Further, when a cooling pipe is provided along the second substrate to allow a cooling medium to flow the pipe, the cooling efficiency can be further improved. For example, a pipe for cooling water arranged at the back of a metal plate made of stainless steel can always cool the device even when the device is irradiated with intense light as used in a high luminance projector, thus making it possible to prevent a malfunction due to heat.

Figure 2:
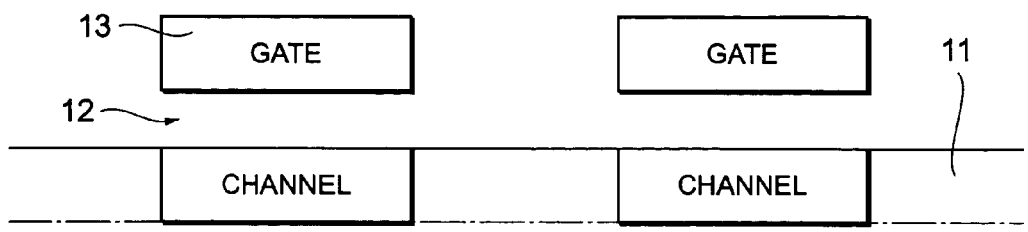
FIG. 2 is a view showing one example of the basic layer structure (single gate structure) in the present invention.
Figure 3:
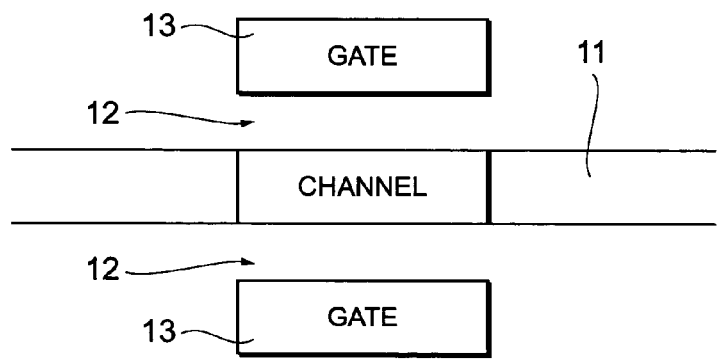
FIG. 3 is a view showing one example of the basic layer structure (double gate structure) in the present invention.
Figure 4:
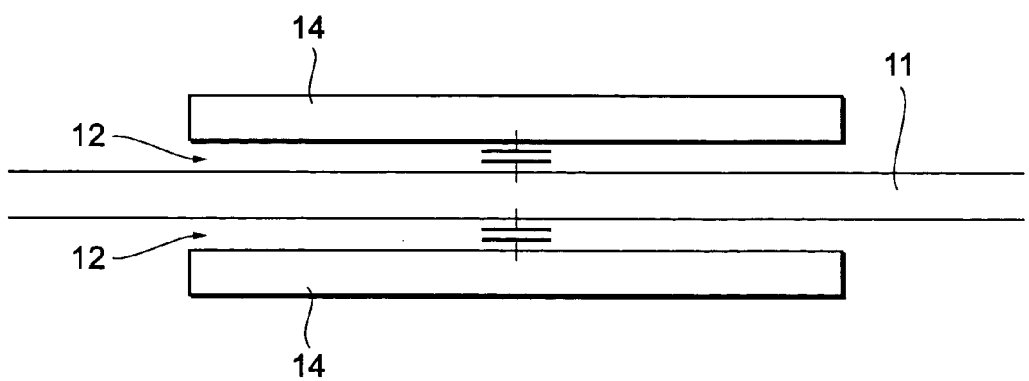
FIG. 4 is a view showing one example of the basic layer structure (double-sided capacitor structure) in the present invention.

FIGS. 2 to 4 show basic structures of thin film semiconductor devices which can be produced by the above-described process for fabricating a thin film semiconductor device. First, as shown in FIG. 2, there can be realized a thin film semiconductor device having a MIS transistor which has a structure comprising, for example, an insulator film 12 and a metal gate 13 successively stacked on the upper surface of a thin film semiconductor layer 11 having a thickness as very small as several hundred angstroms to about 1 μm. A porous semiconductor is formed as a base, and hence a TFT can be formed using a thin film semiconductor layer having a thickness as very small as several hundred angstroms to about 1 μm and having excellent crystalline properties. In addition, in this thin film semiconductor device, the thin film semiconductor layer between the semiconductor devices is physically removed, and therefore an island structure in which each semiconductor device is electrically insulated can be realized, thus enabling a further increase of the degree of integration.

Further, as shown in FIG. 3, there can be realized a thin film semiconductor device having a MIS transistor which has a double gate structure comprising an insulator film 12 and a metal gate 13 successively stacked on both surfaces of a thin film semiconductor layer 11 having a thickness as very small as several hundred angstroms to about 1 μm. The double gate structure realizes a circuit having large driving force. Also in this case, the thin film semiconductor layer between the semiconductor devices is physically removed, and therefore an island structure in which each semiconductor device is electrically insulated can be realized.

Further, as shown in FIG. 4, there can be realized a thin film semiconductor device having a double-sided capacitor comprising an insulator film 12 and a counter electrode 14 successively stacked on both surfaces of a thin film semiconductor layer 11 having a thickness as very small as several hundred angstroms to about 1 μm. The double-sided capacitor realizes a TFT having a larger capacitance. In this case, the thin film semiconductor layer between the semiconductor devices may be removed to form an island structure in which each semiconductor device is electrically insulated.

It is preferred that the above semiconductor device (e.g., MIS transistor) or thin film semiconductor device having a MIS transistor of a double gate structure further has capacitors on both sides of the thin film semiconductor layer 11, i.e., a double-sided capacitor. Further, it is preferred that the semiconductor device (e.g., MIS transistor) or thin film semiconductor device having a MIS transistor of a double gate structure further has a transparent electrode.

Further, it is desired that the semiconductor device (e.g., MIS transistor) or thin film semiconductor device having a MIS transistor of a double gate structure further has a light-shielding layer which can shield a MIS transistor of each type from light. By providing the light-shielding layer, a malfunction of the transistor due to light irradiation can be prevented.

By combining the MIS transistor formed on the thin film semiconductor layer having a thickness of several hundred angstroms to about 1 μm, the capacitors formed on both sides of the thin film semiconductor, the transparent electrodes constituting opposite electrodes, and the liquid crystal layer placed between the pair of transparent electrodes, a liquid crystal display can be formed. Similarly, by combining the MIS transistor of a double gate structure formed on the thin film semiconductor layer having a thickness of several hundred angstroms to about 1 μm, the capacitors formed on both sides of the thin film semiconductor, the transparent electrodes constituting opposite electrodes, and the liquid crystal layer placed between the pair of transparent electrodes, a liquid crystal display can be formed.

As mentioned above, a TFT having very excellent crystalline properties formed using a semiconductor layer having a very small thickness can be used, so that the TFT can be miniaturized, making it possible to realize a liquid crystal display having a high aperture ratio. Further, in this liquid crystal display, by further providing a light-shielding layer for shielding the transistor from light, the liquid crystal display can be prevented from suffering a malfunction of the transistor.

In one embodiment of the present invention, a method is employed in which a process for forming a semiconductor device using a thin film semiconductor layer formed on the upper surface of a porous layer is conducted and the semiconductor device formed is bonded or joined to the second substrate and then separated from the first substrate. Therefore, the first substrate can be used repeatedly, so that the production cost for the thin film semiconductor device can be lowered. Further, the porous layer is formed as a base, and hence a thin film semiconductor layer having excellent crystalline properties can be formed, thus making it possible to realize a semiconductor device having excellent properties.

Further, in one embodiment of the present invention, the semiconductor device is transferred to the second substrate, and then the thin film semiconductor layer on the separated surface is partially removed to electrically insulate the semiconductor devices from one another. Therefore, isolation between the devices can be surely achieved. Furthermore, in one embodiment of the present invention, the semiconductor device is transferred to the second substrate, and then a semiconductor device can be further formed on the thin film semiconductor layer on the separated surface. Therefore, a transistor of a double gate structure or a double-sided capacitor can be relatively easily produced.

The process of the present invention can be applied to, for example, the following uses. First, the process can be applied to not only the above-mentioned TFT for use in liquid crystal display but also a charge coupled device (CCD), a CMOS sensor, a semiconductor integrated circuit, and a solar battery. Particularly, when a portion of the transparent electrode is comprised of a thin film semiconductor, the process can be applied to a CCD or CMOS sensor. Further, by appropriately selecting the material for the second substrate, the process can be applied to a TFT device, CCD, or CMOS sensor having a curved surface.

Hereinbelow, the process for fabricating a thin film single-crystalline silicon TFT according to the embodiment of the present invention will be described. Properties that are not particularly shown in the drawings or described in the present specification may be selected from those known in the field of the invention.

(1) First Embodiment

In the present embodiment, a process for producing a liquid crystal display having a single gate transistor, a capacitor on one side, and a light-shielding plate on one side is described. Here, a series of production steps a1 to a36 are described with reference to FIGS. 5A to 5F.

First, a silicon (Si) substrate 21 is prepared. As the silicon substrate 21, for example, an 8-inch single-crystalline silicon substrate which is of a P type, and which is boron (B)-doped and produced by a CZ method and has a cleavage plane (100) is used. Needless to say, the requirements for the silicon substrate are not limited to those mentioned above (FIG. 5A, a1: silicon substrate).

Then, the silicon substrate 21 is subjected to anodization to form a porous surface. In the anodization, as an electrolytic solution, $HF:C_2H_5OH=1:1$ is used. The current density was changed during the anodization to prepare a porous silicon 22 having a two-layer structure (FIG. 5A, a2: anodization).

Silicon is allowed to undergo epitaxial growth on the porous silicon 22 as a base. In this example, an epitaxial Si layer 23 having a thickness of 100 nm was deposited (FIG. 5A, a3: silicon epitaxial growth).

Then, the silicon substrate is subjected to thermal oxidation to form an oxide film 24 on the surface of the epitaxial Si layer 23 (FIG. 5A, a4: thermal oxidation).

Then, the epitaxial Si layer 23 is ion-implanted with boron. This ion implantation corresponds to doping of a channel layer. In the present embodiment, the channel layer was implanted with boron so that the channel layer became of a P type. When forming a channel layer of an N type, the layer may be doped with, for example, phosphorus (FIG. 5A, a5: channel ion implantation).

Then, a pattern is formed using a resist 25 for preparing an electrode portion for capacitor (FIG. 5A, a6: resist patterning).

Then, the electrode portion of the capacitor is implanted with arsenic in a high concentration so that the electrode portion is of an N type (N++) in high concentration. After the ion implantation, the resist 25 is removed (FIG. 5A, a7: capacitor electrode ion implantation).

Next, a polysilicon layer 26 is deposited by a CVD (chemical vapor deposition) method. This polysilicon layer 26 constitutes a gate electrode material (FIG. 5A, a8: polysilicon CVD).

Then, the polysilicon layer 26 is subjected to dry etching to form a gate electrode. This electrode serves as a front gate (FIG. 5A, a9: dry etching for front gate formation).

Then, the entire surface is subjected to ion implantation for LDD (lightly doped drain). In the present embodiment, the surface is implanted with phosphorus so that the LDD layer is of an N type (N+) (FIG. 5A, a10: LDD ion implantation).

Then, a $SiO_2$ film 27 is deposited on the entire surface by a CVD (chemical vapor deposition) method (FIG. 5A, a11: silicon dioxide CVD).

Figure 5B:
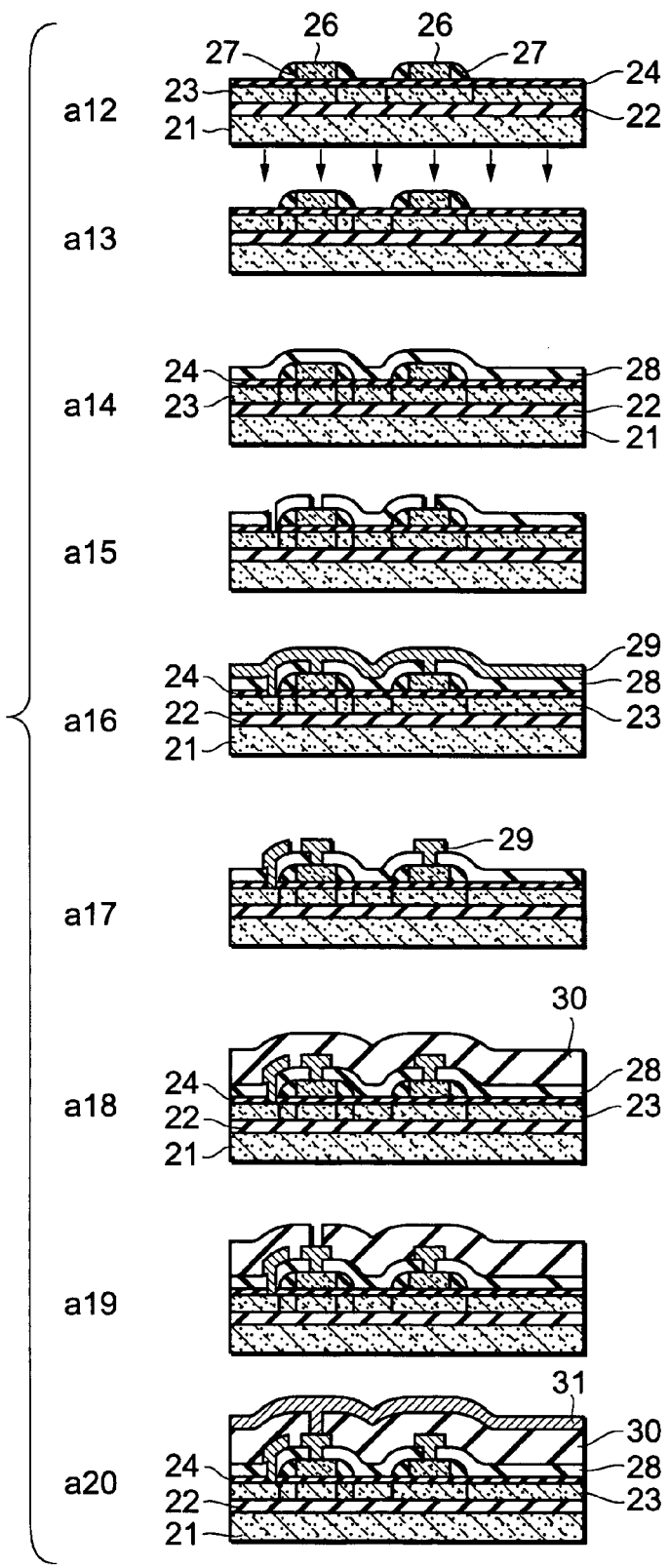

Then, the entire surface is subjected to dry etching to form a sidewall (FIG. 5B, a12: sidewall formation).

Then, ion implantation is conducted to form source-drain regions. In the present embodiment, the surface is implanted with arsenic so that the source-drain regions are of an N type (N++) in high concentration (FIG. 5B, a13: source-drain ion implantation).

Then, a $SiO_2$ film 28 is deposited by a CVD method (FIG. 5B, a14: silicon dioxide CVD).

Then, for taking an electrode out of the front gate, a contact hole is formed by dry etching (FIG. 5B, a15: dry etching for contact hole formation).

Next, for forming an electrode, a conductive electrode material layer 29 is deposited. As the electrode material, a material generally used for forming an integrated circuit is used. Specific examples include heavy metals, such as Al, W, Ti, Cu, Co, Mg, Pt, and Au; and alloys (silicides) of silicon and a metal, such as WSi, TiSi, and CoSi. Any materials other than these can be used as long as they are conductive. In the present embodiment, Al is deposited by sputtering (FIG. 5B, a16: Al sputtering).

Then, the unnecessary electrode material is removed by dry etching to form an electrode member (FIG. 5B, a17: dry etching for electrode formation).

Then, a $SiO_2$ film 30 is deposited by a CVD method (FIG. 5B, a18: silicon dioxide CVD).

Then, for forming multi-layer interconnection, a contact hole is formed by dry etching (FIG. 5B, a9: dry etching for contact hole formation).

Next, a light-shielding layer 31 for shielding the TFT portion from light is deposited. As a material for the light-shielding layer, any material having properties of shielding light can be used. Specific examples include heavy metals, such as Al, W, Ti, Cu, and Co; and alloys (silicides) of silicon and a metal, such as WSi and TiSi. Any materials other than these can be used as long as they are light-shielding materials. In the present embodiment, Ti is deposited by sputtering (FIG. 5B, a20: BLK (blanket) member sputtering).

Figure 5C:
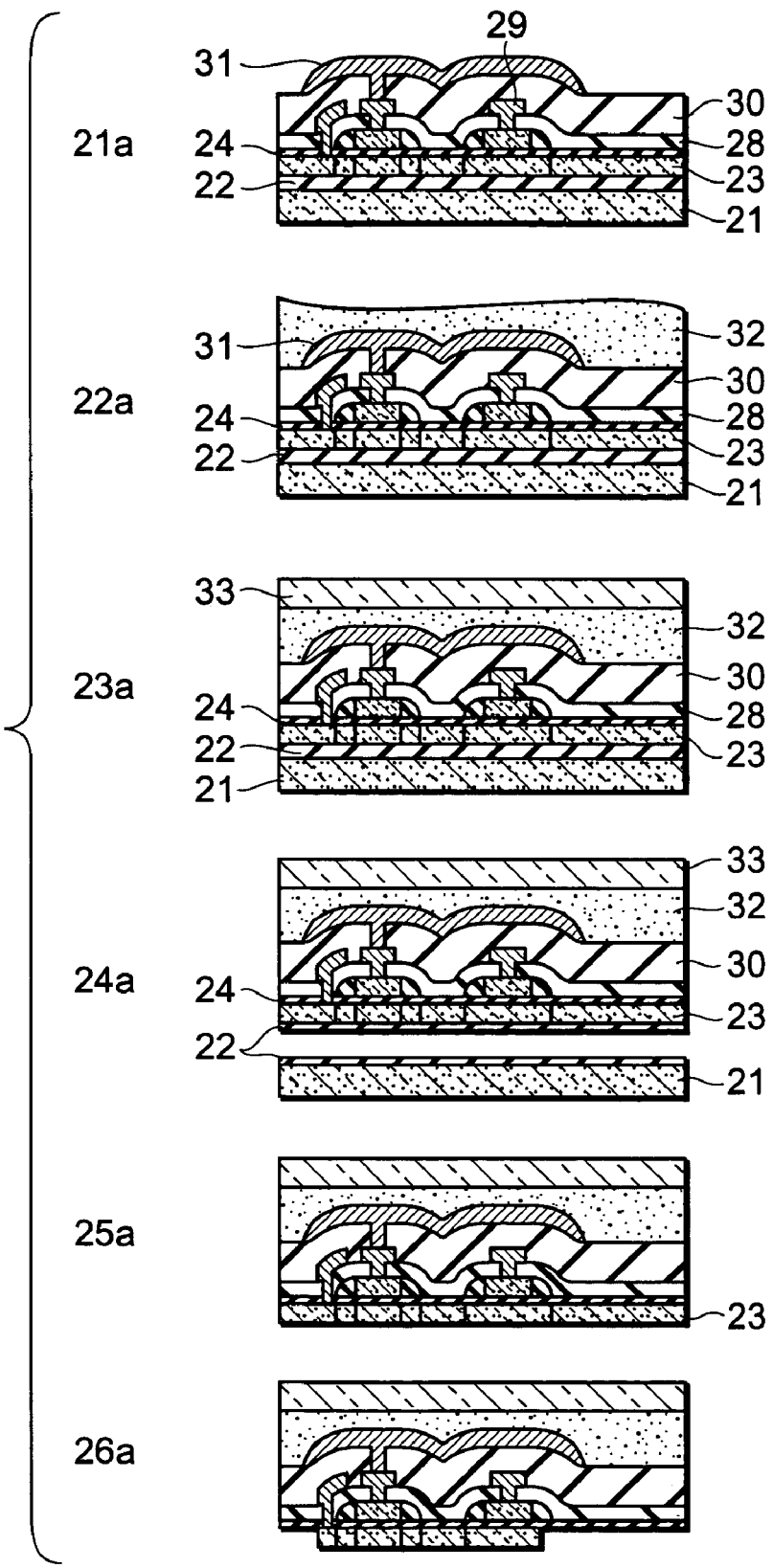

Then, the unnecessary light-shielding material is removed by dry etching to form a light-shielding member (FIG. 5C, a21: dry etching for BLK formation).

Then, a bonding agent is applied to the surface to form a bonding layer 32. As a material for the bonding layer, a material having bonding properties is used. Specifically, a commercially available bonding agent or self-bonding agent is used. As alternative junction materials, in the bonding layer, materials, such as SOG (spin on glass), PSG (phospho silicate glass), BPSG (boron phosphorous silicate glass), and sol gel, can be used. These are materials having properties such that the material applied is attached to a supporting substrate and then exposed to a high temperature to achieve bonding.

These junction materials are improved in bonding force when the surface of the material is ground and smoothed and then bonded to the substrate. As further alternative junction materials, materials having properties such that they can be bonded by heating can be used. Examples include EVA (ethylene-vinyl acetate copolymer resin) generally used in production of solar batteries. As alternative bonding materials, self-bonding materials which can be repeatedly bonded and peeled off may be used. In the present embodiment, bonding is conducted using a commercially available bonding agent (FIG. 5C, a22: bonding agent application).

Next, a glass substrate 33 is bonded to the semiconductor device. The glass substrate 33 is an example of the second substrate defined in the claims. In this instance, it is desired that no air bubbles are formed between the TFT layer and the glass substrate. For example, when bonding is carried out in a vacuum using a vacuum laminator, no air bubbles are formed. The operation for bonding is advantageously conducted in a vacuum atmosphere using an apparatus for creating a vacuum atmosphere. In the present embodiment, bonding is conducted using a vacuum laminator (FIG. 5C, a23: bonding).

After the semiconductor device is bonded and fixed to the glass substrate 33, the TFT portion is separated from the supporting substrate (silicon substrate 21) at a portion of the porous silicon 22 having a multi-layer structure. The separated semiconductor substrate (silicon substrate 21) can be reused. The separation is achieved using a known method, such as a method in which an external force is exerted on the side of the porous silicon 22 to physically form a notch and then the substrate is peeled off mechanically or a method in which the porous silicon is cut using an ultra-high pressure water stream (FIG. 5C, a24: separation).

Then, the porous silicon 22 remaining on the separated surface is removed. The porous silicon can be removed by etching using a chemical or by dry etching in a gas atmosphere. When using a spin etcher as an apparatus for removal, a smooth surface having little unevenness can be formed. Alternatively, a grinder or CMP (chemical mechanical polish) may be used. As the chemical, an agent having properties such that it can etch the porous silicon may be used. Examples include a mixture of hydrofluoric acid and nitric acid, a mixture of hydrofluoric acid, nitric acid, and acetic acid, and a mixture of hydrofluoric acid and aqueous hydrogen peroxide. In the present embodiment, etching with a mixture of hydrofluoric acid and nitric acid was performed using a spin etcher (FIG. 5C, a25: porous silicon removal).

Next, the epitaxial Si layer 23 exposed through the separated surface is subjected to dry etching to form an SOI island (FIG. 5C, a26: SOI island formation).

Figure 5D:
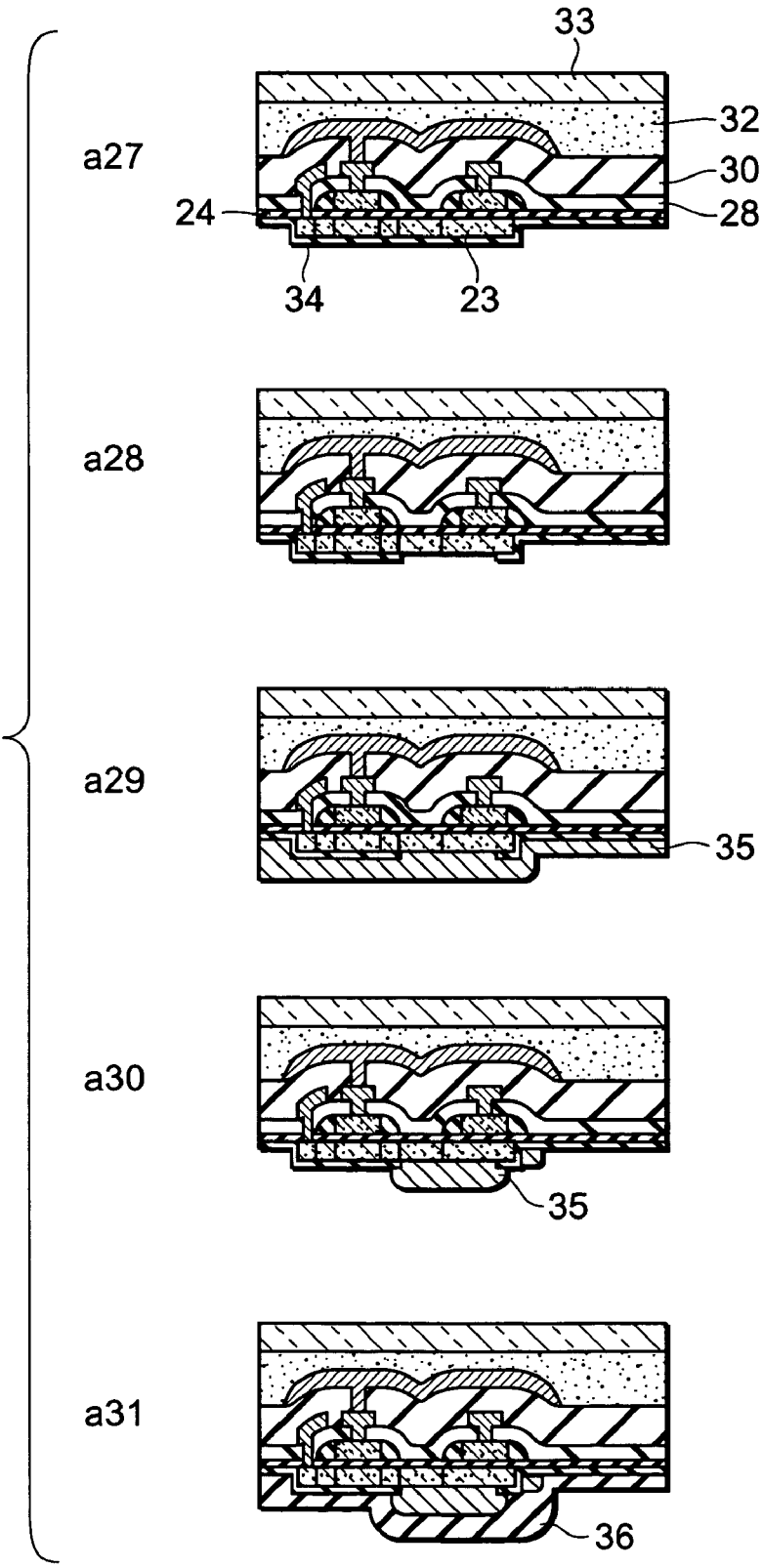

Then, a $SiO_2$ film 34 is deposited by a CVD method (FIG. 5D, a27: silicon dioxide CVD).

Then, for forming a contact hole, the $SiO_2$ film 34 is subjected to dry etching (FIG. 5D, a28: contact hole formation).

Then, a light-shielding layer 35 for shielding the TFT portion from light is deposited. As a material for the light-shielding layer, any material having properties of shielding light can be used. Specific examples include heavy metals, such as Al, W, Ti, Cu, and Co; and alloys of silicon and a metal, such as WSi and TiSi. Any materials other than these can be used as long as they are materials having light-shielding properties. In the present embodiment, tungsten (W) was deposited by sputtering (FIG. 5D, a29: BLK member sputtering).

Then, the unnecessary light-shielding layer 35 is removed by dry etching to form a light-shielding member (FIG. 5D, a30: dry etching).

Then, a $SiO_2$ film 36 is deposited by a CVD method (FIG. 5D, a31: silicon dioxide CVD).

Then, for forming a contact hole, the $SiO_2$ film 36 is subjected to dry etching (FIG. 5E, a32: contact hole formation).

Next, a transparent electrode layer 37 is deposited. In the transparent electrode, a material generally used in a TFT, solar battery, or organic EL element can be used. Examples include ITO, ZnO, and SnO. In the present embodiment, ITO is deposited by sputtering (FIG. 5E, a33: ITO sputtering).

Then, the unnecessary transparent electrode material is removed by etching to form a transparent electrode member (FIG. 5E, a34: transparent electrode formation).

Figure 5F:
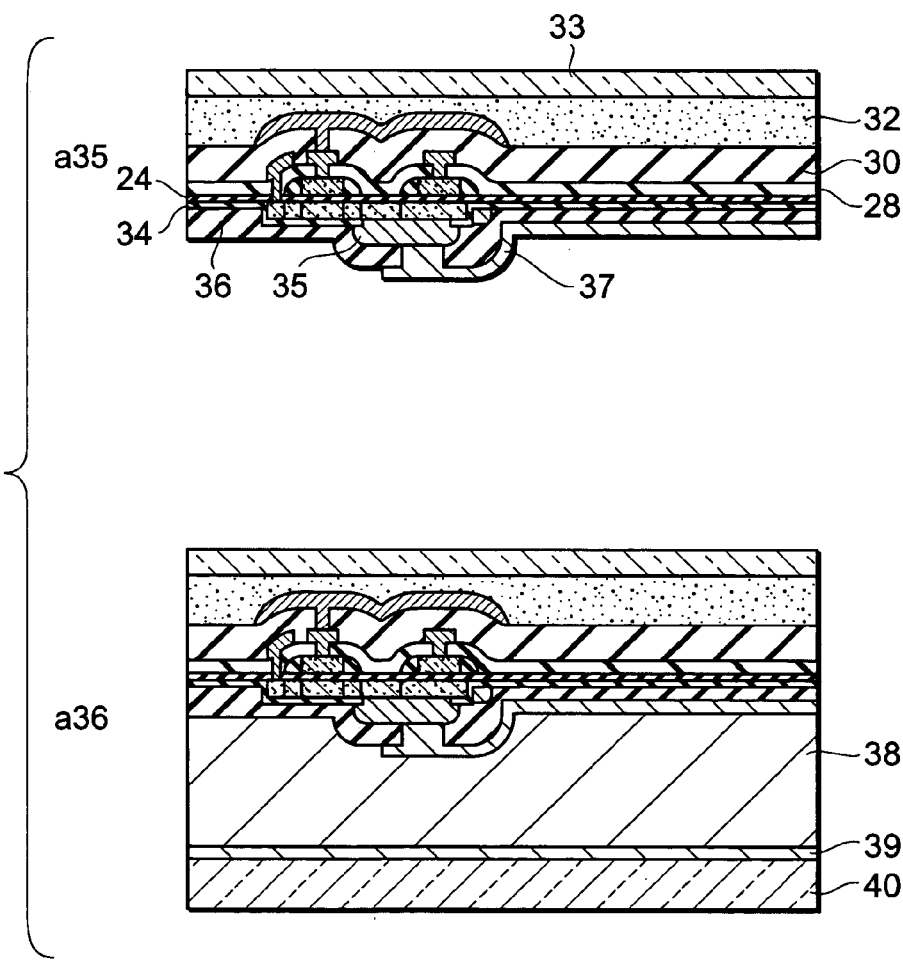

Thus, a TFT unit (member) is completed (FIG. 5F, a35: TFT unit completion).

Further, the TFT and a glass substrate 40 having thereon a counter electrode 39 are arranged so that the electrode 39 faces the TFT, and a space between them is filled with a liquid crystal material 38 to complete a liquid crystal display (FIG. 5F, a36: liquid crystal filling). FIG. 6 shows a diagrammatic cross-sectional structure of the liquid crystal display produced in the present embodiment.

(2) Second Embodiment

Figure 7A:
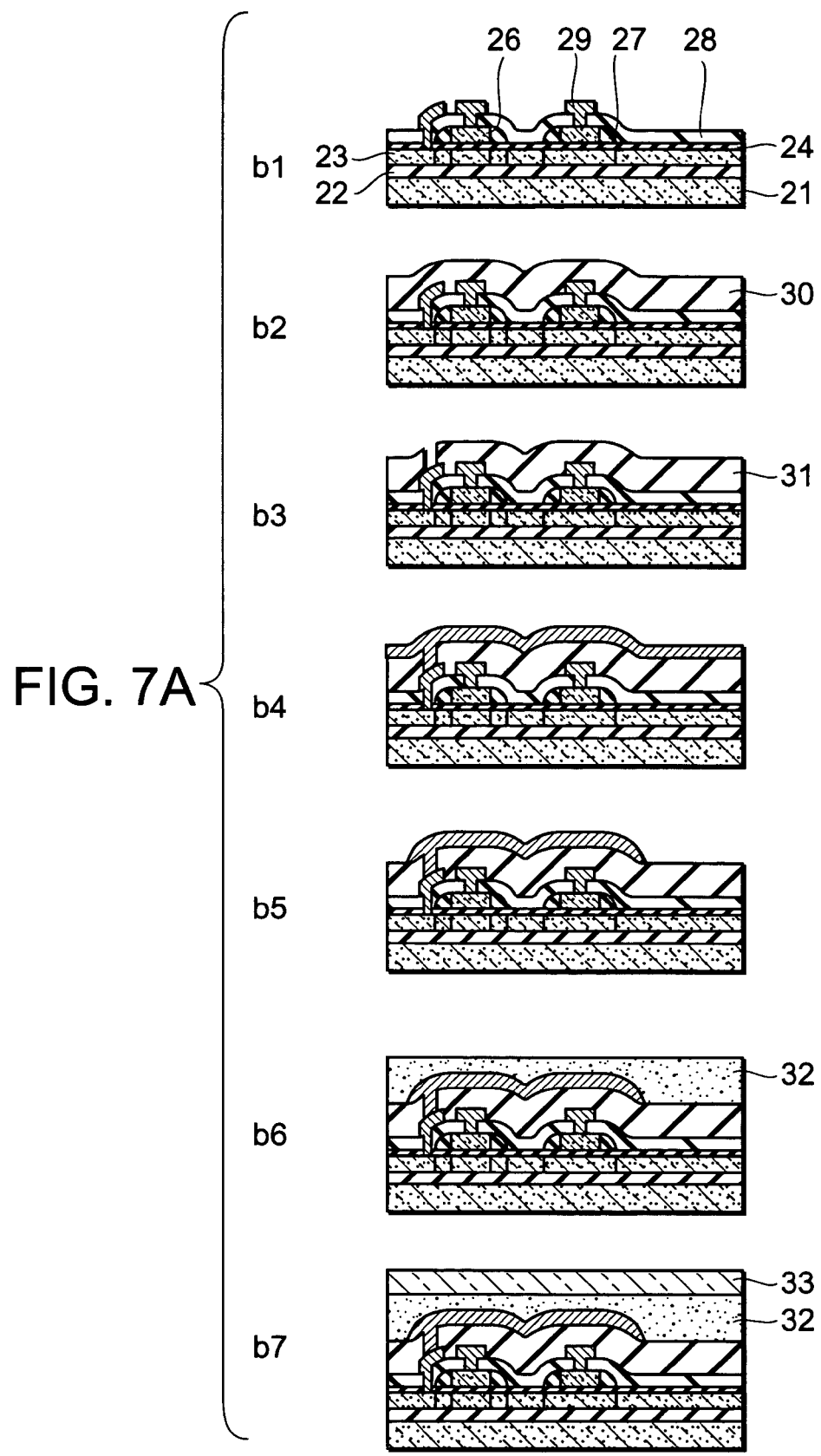
FIGS. 7A to 7D are views showing a fabrication process according to the second embodiment.

In the present embodiment, a process for producing a liquid crystal display having a double gate transistor, a double-sided capacitor, and light-shielding plates on both sides is described. In FIGS. 7A, b1 to 7D, b23 and FIGS. 5A, a1 to 5F, a36, like parts or portions are indicated by like reference numerals.

A process comprising the steps shown in FIG. 5A, a1 through 5B, a17 in the first embodiment is carried out. Therefore, the same layer structure is obtained (FIG. 7A, b1).

Then, a $SiO_2$ film 30 is deposited by a CVD method (FIG. 7A, b2: silicon dioxide CVD).

Then, for forming a contact hole, the $SiO_2$ film 30 is subjected to dry etching (FIG. 7A, b3: contact hole formation).

Then, a light-shielding layer 31 for shielding the TFT portion from light is deposited. As a material for the light-shielding layer, any material having properties of shielding light can be used. Specific examples include heavy metals, such as Al, W, Ti, Cu, and Co; and alloys (silicides) of silicon and a metal, such as WSi and TiSi. Any materials other than these can be used as long as they are light-shielding materials. In the present embodiment, Ti is deposited by sputtering (FIG. 7A, b4: metal sputtering).

Then, the unnecessary light-shielding material is removed by dry etching to form a light-shielding member (FIG. 7A, b5: BLK formation).

Then, a bonding agent is applied to the surface to form a bonding layer 32. As a material for the bonding layer, a material having bonding properties is used. Specifically, a commercially available bonding agent or self-bonding agent is used. As alternative junction materials, in the bonding layer, materials, such as SOG, PSG, BPSG, and sol gel, can be used. These are materials having properties such that the material applied is attached to a supporting substrate and then exposed to a high temperature to achieve bonding. These junction materials are improved in bonding force when the surface of the material is ground and smoothed and then bonded to the substrate. As further alternative junction materials, materials having properties such that they can be bonded by heating can be used. Examples include EVA generally used in production of solar batteries. As alternative bonding materials, self-bonding materials which can be repeatedly bonded and peeled off may be used. In the present embodiment, SOG is applied. After applying SOG, the resultant product was baked and then ground for smoothing the surface (FIG. 7A, b6: bonding agent application).

Next, a glass substrate 33 is bonded to the bonding layer 32. In this instance, it is desired that no air bubbles are formed between the TFT layer and the glass substrate. In the present embodiment, the glass substrate and the Si substrate having formed a TFT are subjected to wet cleaning so that the surface becomes hydrophilic. Then, bonding is carried out. After the bonding, the resultant product was subjected to annealing in a high-temperature atmosphere (FIG. 7A, b7: substrate bonding).

After the semiconductor device is bonded and fixed to the glass substrate 33, the TFT portion is separated from the supporting substrate (silicon substrate 21) at a portion of the porous silicon 22 having a multi-layer structure. The separated semiconductor substrate can be reused (FIG. 7B, b8: separation).

Then, the porous silicon 22 remaining on the separated surface is removed. In the present embodiment, etching with a mixture of hydrofluoric acid and nitric acid was performed using a spin etcher (FIG. 7B, b9: porous silicon removal).

Figure 7B:
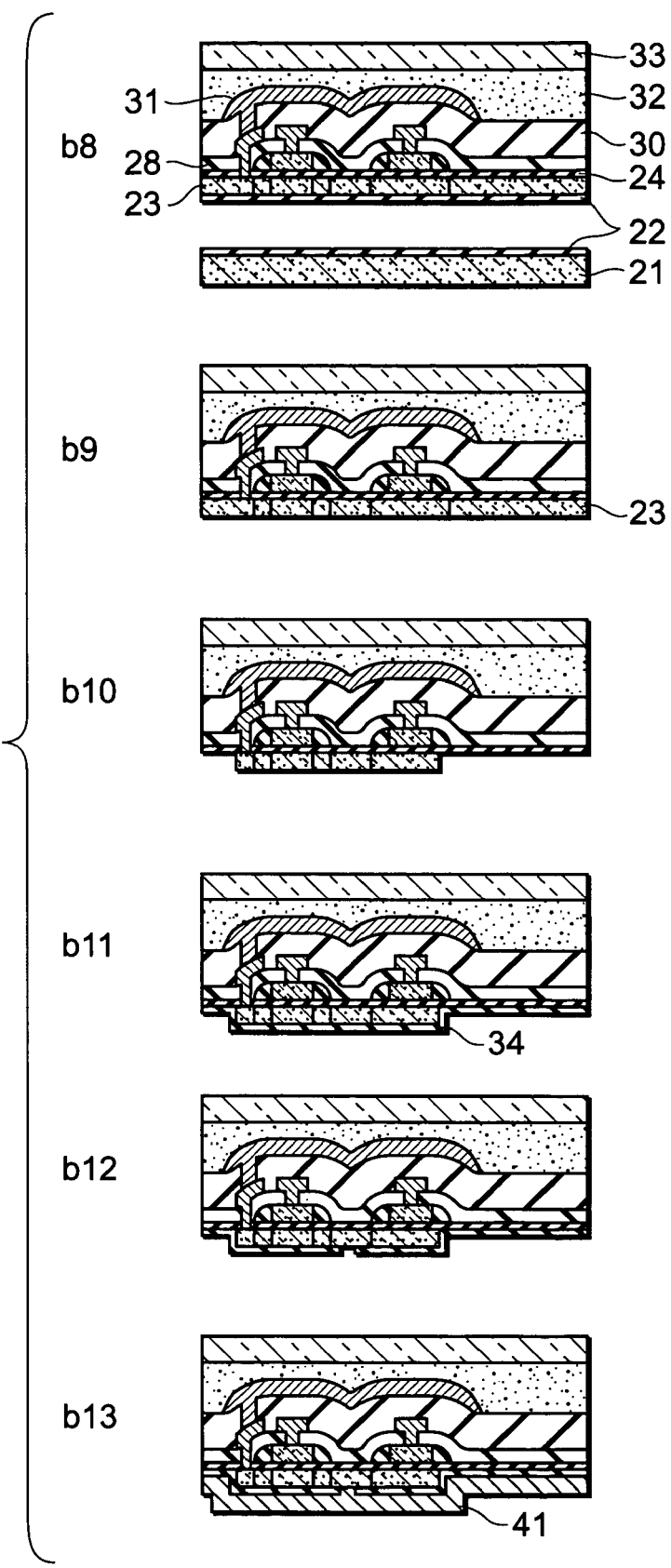

Then, the epitaxial Si layer 23 exposed through the separated surface is subjected to dry etching to form an SOI island (FIG. 7B, b10: SOI island formation).

Then, a $SiO_2$ film 34 is deposited by a CVD method. The $SiO_2$ film 34 serves as a gate oxide film for the back gate. Simultaneously, it serves as an insulating material for the double-sided capacitor. When using a material having a high dielectric constant, the capacitance of the capacitor can be increased. Examples of the materials include SiN, PZT, SBT, A1203, and HfO. Further, a high dielectric-constant material used in a general semiconductor device can be used. In the present embodiment, as mentioned above, the $SiO_2$ film 34 was deposited by a CVD method (FIG. 7B, b11: silicon dioxide CVD).

Then, for forming a contact hole, the $SiO_2$ film 34 is subjected to dry etching (FIG. 7B, b12: contact hole formation).

Then, a conductive layer 41 is deposited wherein the conductive layer 41 serves as a conductive electrode material for the back gate and the double-sided capacitor. As the electrode material, a conductive material generally used for forming a semiconductor integrated circuit can be used. Specific examples include heavy metals, such as Al, W, Ti, Cu, Co, and Mg; and alloys of silicon and a metal, such as WSi and TiSi. Any materials other than these can be used as long as they are conductive. In the present embodiment, aluminum (Al) was deposited by sputtering (FIG. 7B, b13: BLK member sputtering).

Figure 7C:
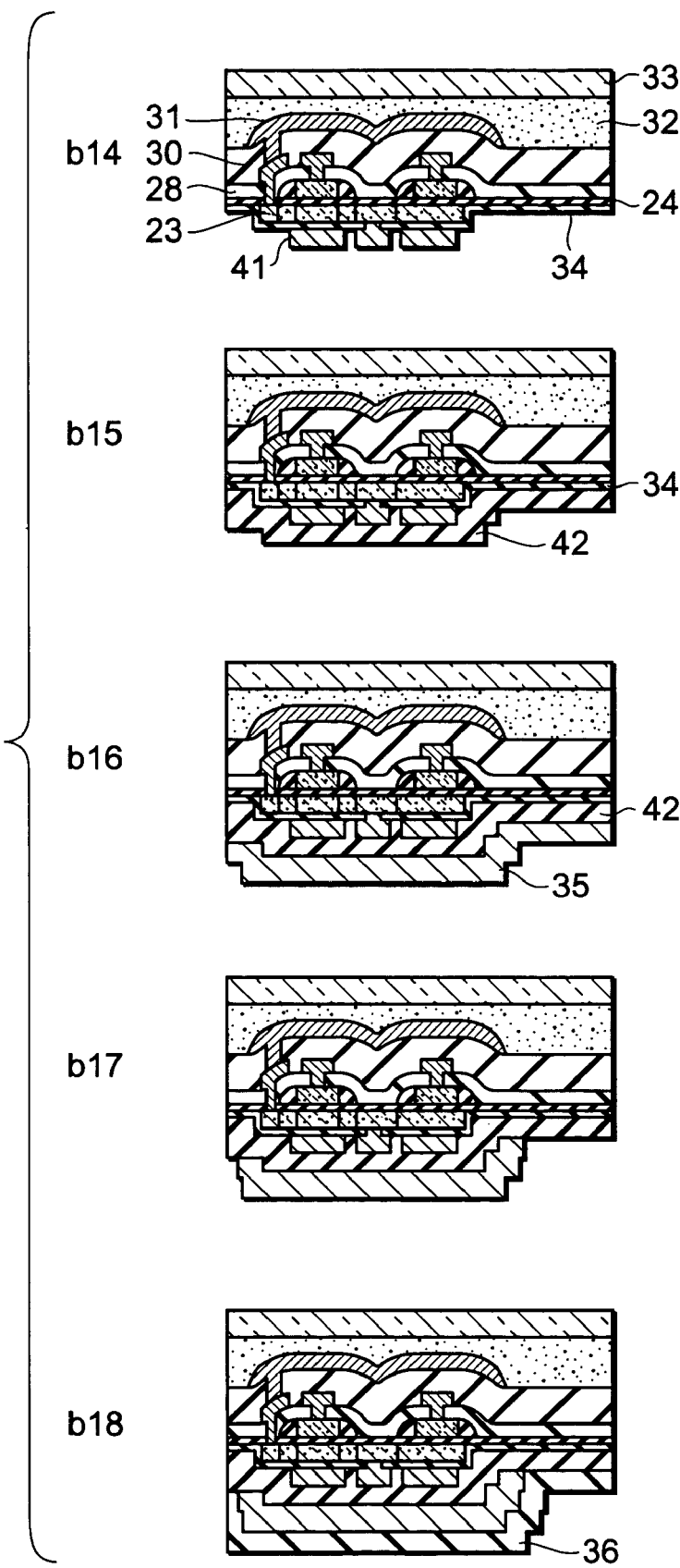

Then, the unnecessary electrode material portion of the conductive layer 41 is removed by dry etching to form an electrode member (FIG. 7C, b14: dry etching).

Then, a $SiO_2$ film 42 is deposited by a CVD method (FIG. 7C, b15: silicon dioxide CVD).

Next, a light-shielding layer 35 for shielding the TFT portion from light is deposited. As a material for the light-shielding layer, any material having properties of shielding light can be used. Specific examples include heavy metals, such as Al, W, Ti, Cu, and Co; and alloys of silicon and a metal, such as WSi and TiSi. Any materials other than these can be used as long as they are light-shielding materials. In the present embodiment, tungsten silicide (WSi) was deposited by a CVD method (FIG. 7C, b16: metal sputtering).

Then, the unnecessary light-shielding layer 35 is removed by dry etching to form a light-shielding member (FIG. 7C, b17: dry etching for BLK formation).

Then, a $SiO_2$ film 36 is deposited by a CVD method (FIG. 7C, b18: silicon dioxide CVD).

Then, for forming a contact hole, the $SiO_2$ film 36 is subjected to dry etching. The contact hole is formed so as to achieve electrical conduction between the transparent electrode and the drain portion (FIG. 7D, b19: contact hole formation).

Then, a transparent electrode 37 is formed. As the transparent electrode material, a general transparent electrode material can be used as described in connection with the step shown in FIG. 5-5 a33 in the first embodiment. In the present embodiment, ITO is used (FIG. 7D, b20: ITO film sputtering).

Figure 7D:
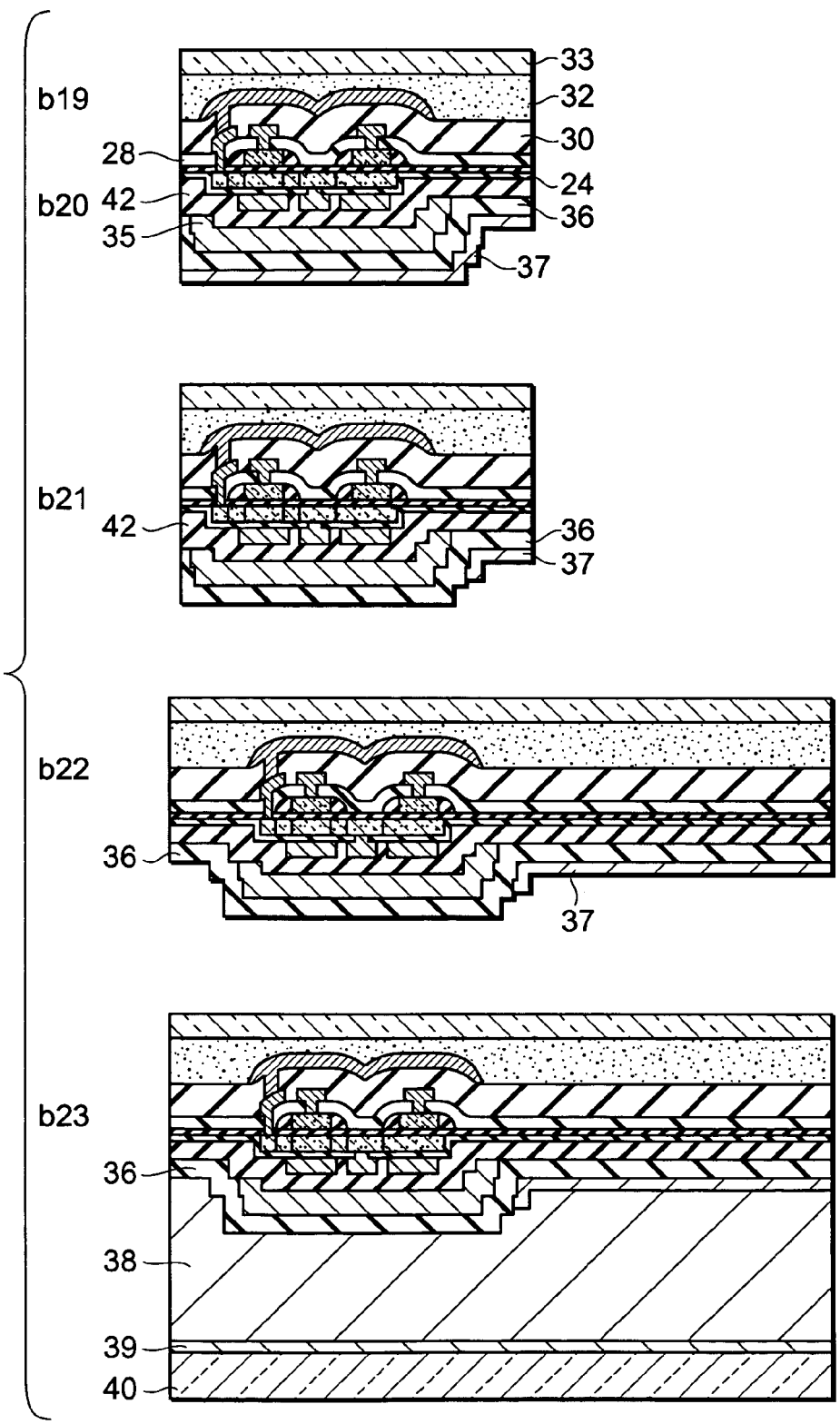

Then, the unnecessary transparent electrode material is removed by etching to form a transparent electrode member (FIG. 7D, b21: transparent electrode formation).

Thus, a TFT unit (member) is completed (FIG. 7D, b22).

Further, the TFT and a glass substrate 40 having thereon a counter electrode 39 are arranged so that the electrode 39 faces the TFT, and a space between them is filled with a liquid crystal material 38 to complete a liquid crystal display (FIG. 7D, b23: liquid crystal filling and LCD panel completion).

FIG. 8 shows a diagrammatic cross-sectional structure of the liquid crystal display produced in the present embodiment.

(3) Third Embodiment

Figure 9A:
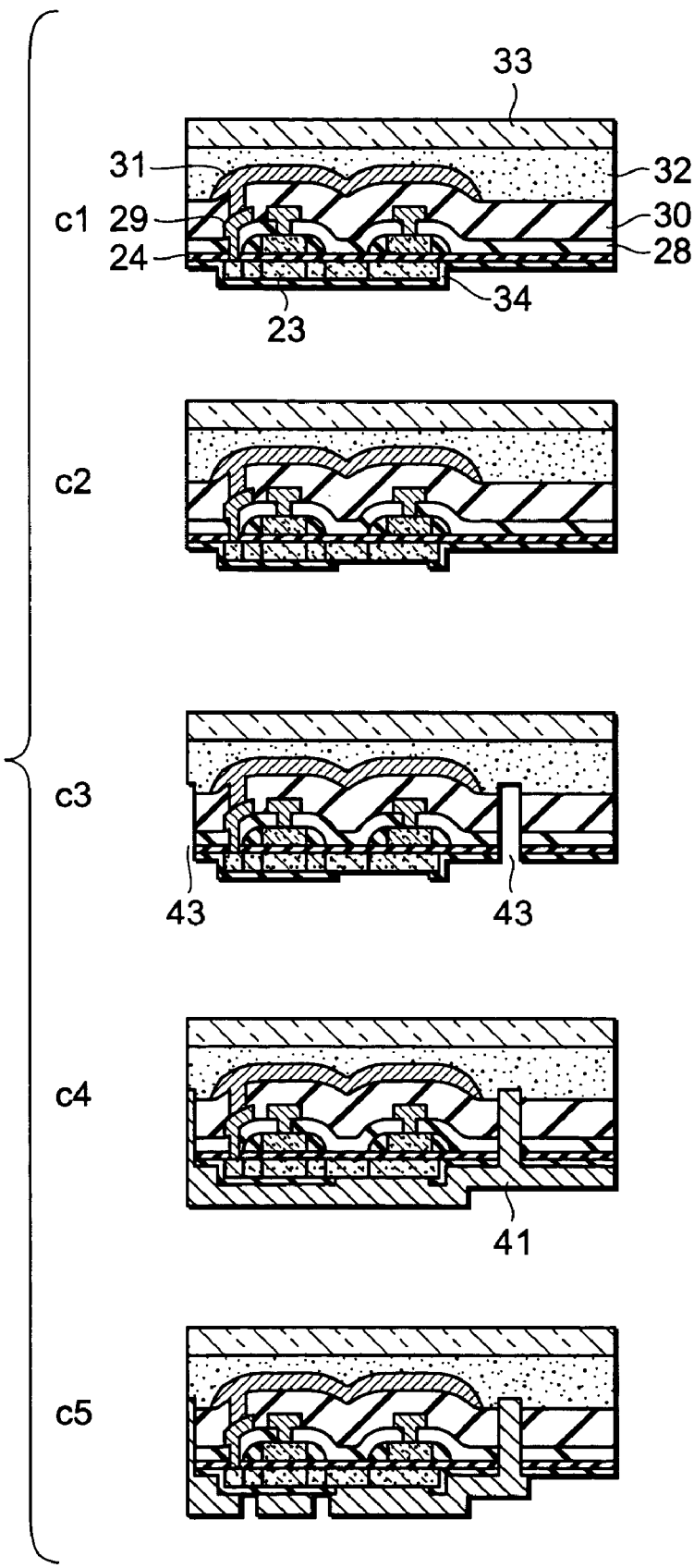

In the present embodiment, a process for producing a liquid crystal display having a double gate transistor, a capacitor on one side, and light-shielding plates on both sides is described. Here, a series of production steps shown in FIGS. 9A to 9D are described. In FIGS. 9A, c1 to 9D, c15, FIGS. 5A, a1 to 5F, a36, and FIGS. 7A, b1 to 7D, b23, like parts or portions are indicated by like reference numerals.

A process comprising the steps shown in FIGS. 5A, a1 through 5D, a27 in the first embodiment is carried out. Here, a $SiO_2$ film 34 is deposited by a CVD method. Like in the step shown in FIG. 7B, b13 in the second embodiment, the $SiO_2$ film 34 serves as both a gate oxide film for the back gate and an insulating material for the double-sided capacitor. When using a material having a high dielectric constant, the capacitance of the capacitor can be increased. In the present embodiment, as mentioned above, the $SiO_2$ film 34 was deposited by a CVD method (FIG. 9A, c1).

Then, for forming a contact hole, the $SiO_2$ film 34 is subjected to dry etching (FIG. 9A, c2: contact hole formation).

Then, the $SiO_2$ film 34 is subjected to dry etching for the outer periphery portion of the TFT to form trenches 43 so as to shield the side regions of the TFT from light (FIG. 9A, c3: formation of hole for side light-shielding plate).

Next, a conductive layer 41 is deposited wherein the conductive layer 41 serves as a conductive electrode material for the back gate and the double-sided capacitor. As the electrode material, a conductive material generally used for forming a semiconductor integrated circuit can be used. In this case, it is preferred to use a material and a deposition method which can completely fill the trenches 43. Specific examples of materials include heavy metals, such as Al, W, Ti, Cu, Co, Mg, Pt, and Au; and alloys of Si and a metal, such as WSi and TiSi. Any materials other than these can be used as long as they are conductive. In the present embodiment, WSi was deposited by a CVD method. The conductive layer 41 is used for junction wiring to the transparent electrode in the subsequent step (FIG. 9A, c4: BLK member sputtering).

Then, the unnecessary electrode material (light-shielding material) is removed by dry etching to form an electrode member. This electrode member serves also as a light-shielding layer which shields light in the vertical and horizontal directions as viewed in the figures (FIG. 9A, c5: BLK formation).

Figure 9B:
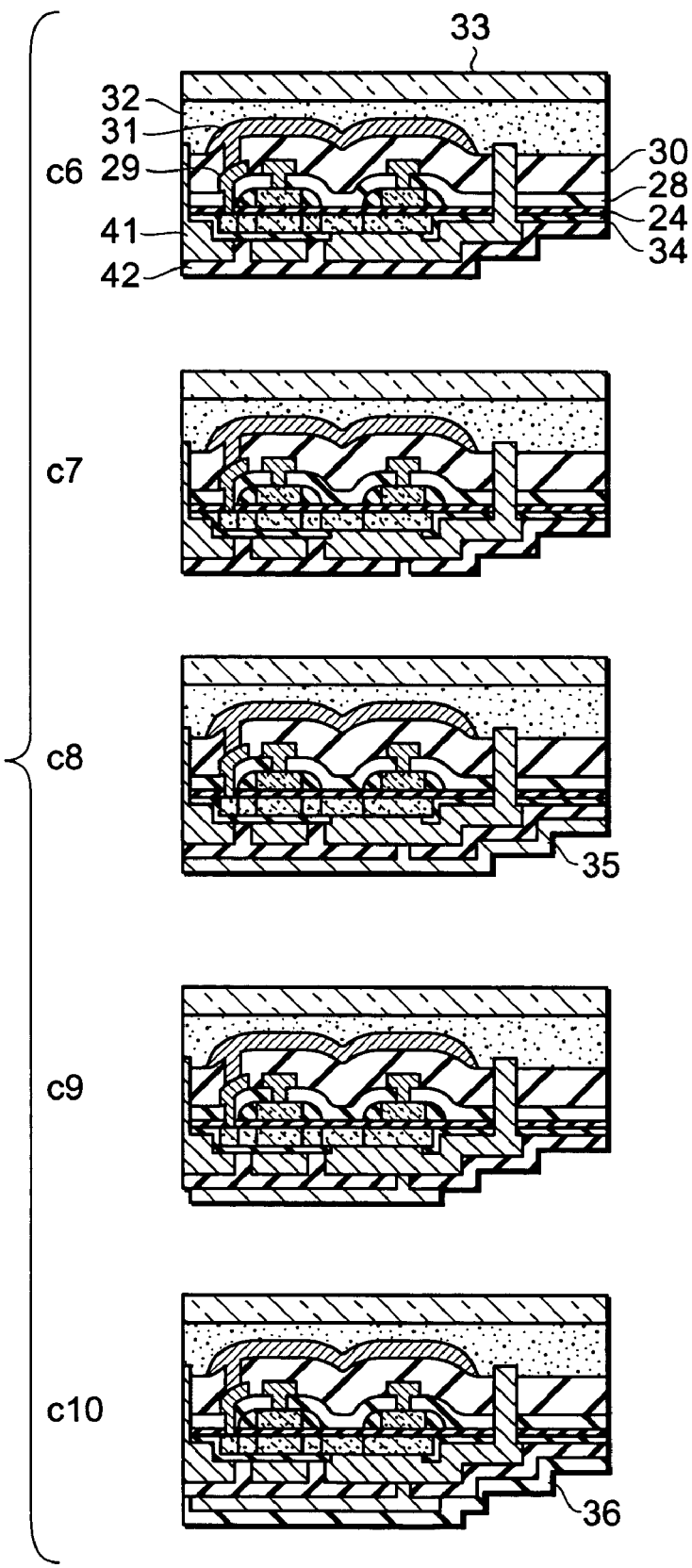

Then, a $SiO_2$ film 42 is deposited by a CVD method (FIG. 9B, c6: silicon dioxide CVD).

Then, for forming a contact hole, the $SiO_2$ film 42 is subjected to dry etching. The contact hole is formed so as to achieve electrical conduction between the transparent electrode (transparent electrode 37 described below) and the drain portion (FIG. 9B, c7: contact hole formation).

Next, a light-shielding layer 35 for shielding the TFT portion from light is deposited. The light-shielding layer 35 is used for junction wiring to the transparent electrode in the subsequent step. As a material for the light-shielding layer, any material having properties of shielding light can be used. Specific examples include heavy metals, such as Al, W, Ti, Cu, and Co; and alloys of silicon and a metal, such as WSi and TiSi. Any materials other than these can be used as long as they are materials having light-shielding properties. In the present embodiment, titanium silicide (TiSi) was deposited by a CVD method (FIG. 9B, c8: BLK member sputtering).

Then, the unnecessary light-shielding layer 35 is removed by dry etching to form a light-shielding member (FIG. 9B, c9: BLK formation).

Then, a $SiO_2$ film 36 is deposited by a CVD method (FIG. 9B, c10: silicon dioxide CVD).

Then, for forming a contact hole, the $SiO_2$ film 36 is subjected to dry etching. The contact hole is formed so as to achieve electrical conduction between the transparent electrode and the drain portion (FIG. 9C, c11: contact hole formation).

Next, a transparent electrode layer 37 is deposited. As the transparent electrode, like in the step shown in FIG. 5E, a33 in the first embodiment, a general transparent electrode material is used. In the present embodiment, ITO is deposited by sputtering (FIG. 9C, c12: ITO sputtering).

Then, the unnecessary transparent electrode material is removed by etching to form a transparent electrode member (FIG. 9C, c13: transparent electrode formation).

Figure 9D:
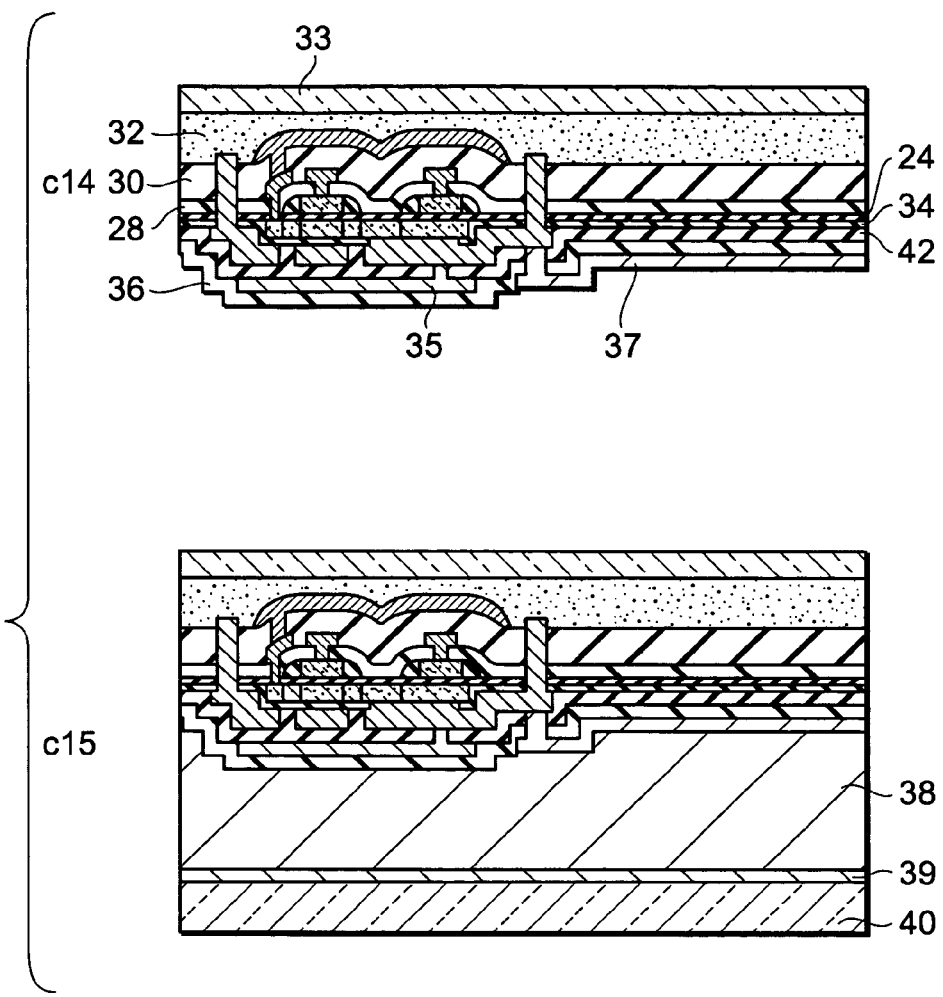

Thus, a TFT unit (member) is completed (FIG. 9D, c14: TFT unit completion).

Figure 10:
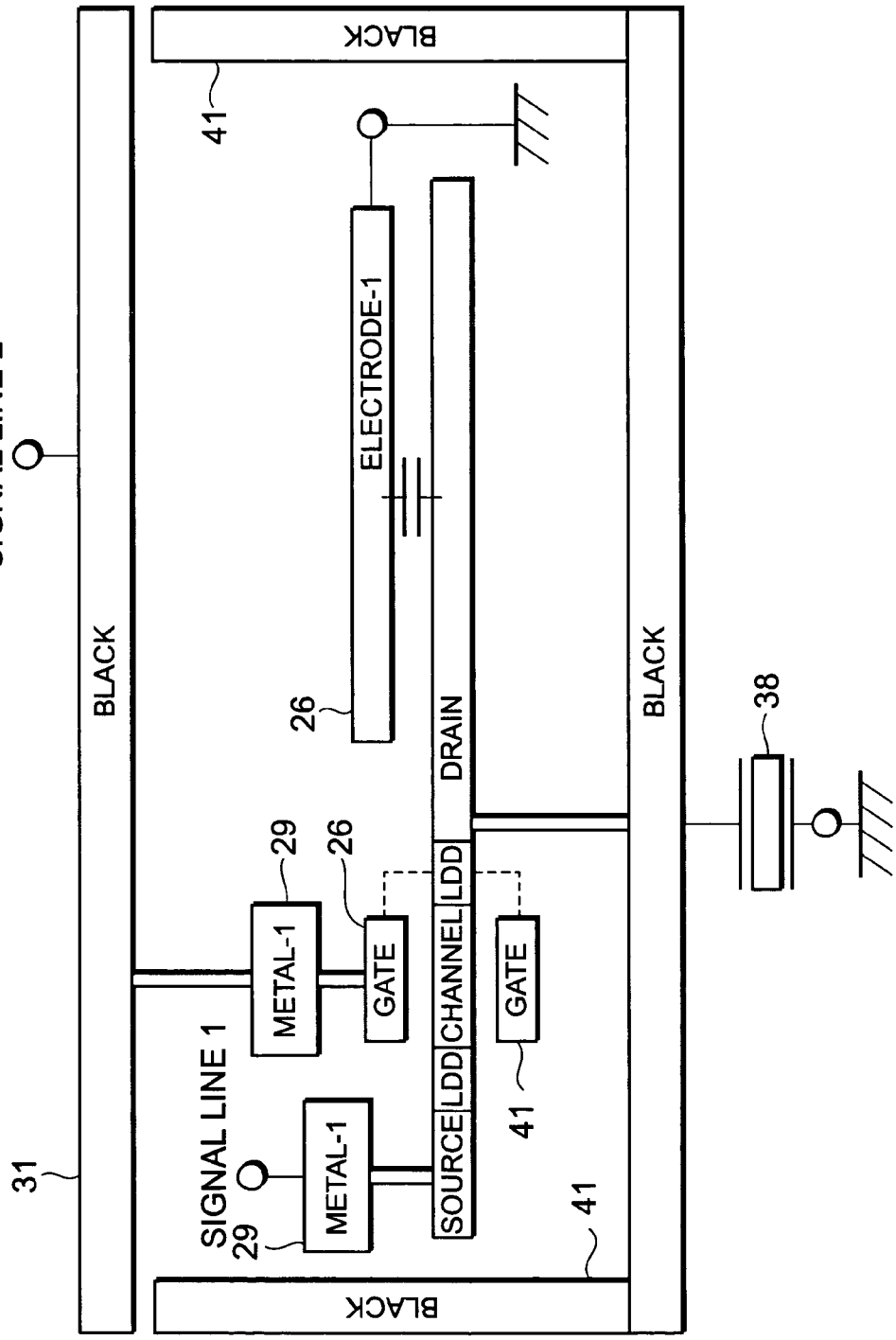
FIG. 10 is a view showing the diagrammatic cross-sectional structure of a liquid crystal display produced in the third embodiment.

Further, the TFT and a glass substrate 40 having thereon a counter electrode 39 are arranged so that the electrode 39 faces the TFT, and a space between them is filled with a liquid crystal material 38 to complete a liquid crystal display (FIG. 9D, c15: LCD panel completion). FIG. 10 shows a diagrammatic cross-sectional structure of the liquid crystal display produced in the present embodiment.

(4) Fourth Embodiment

Figure 11A:
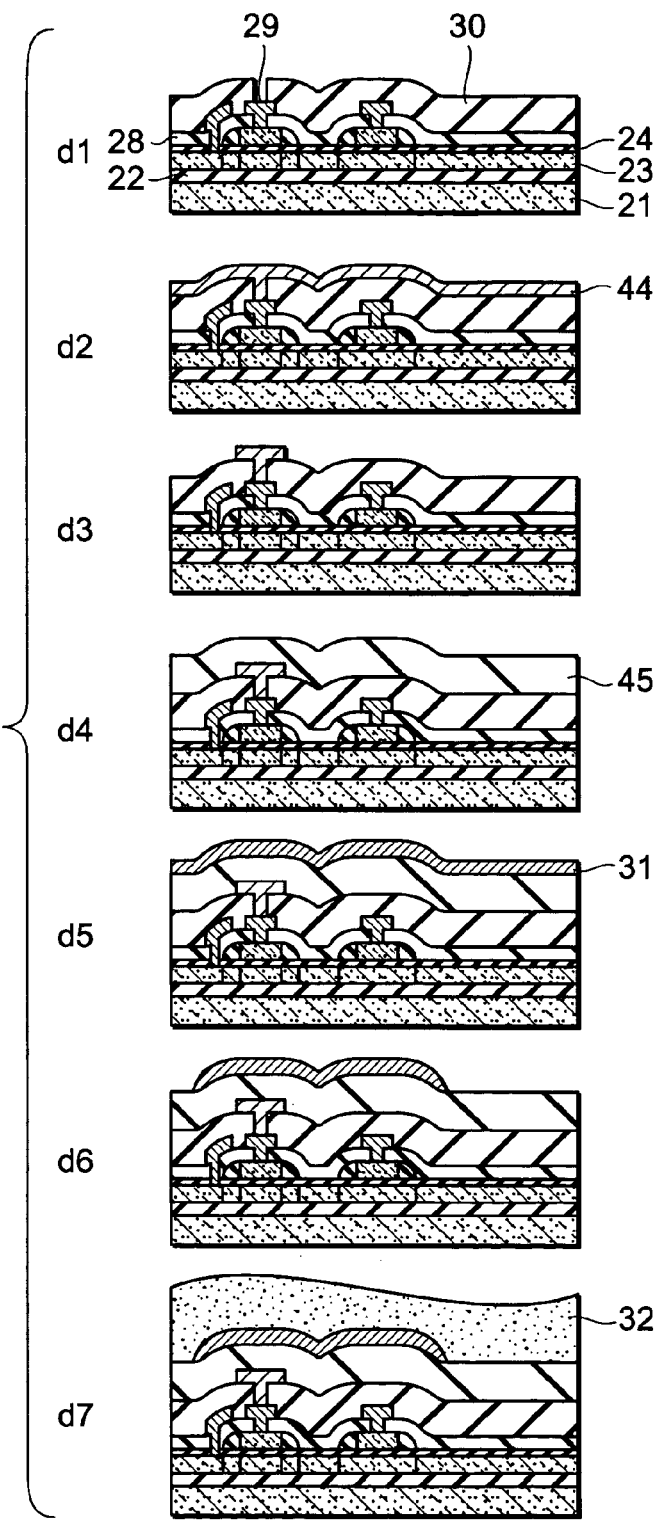

In the present embodiment, another process for producing a liquid crystal display having a double gate transistor, a double-sided capacitor, and a complete (four-side) light-shielding plate is described. In FIGS. 11A, d1 to 11F, d26 and the drawings used for describing the other embodiments above, like parts or portions are indicated by like reference numerals.

A process comprising the steps shown in FIGS. 5A, a1 through 5B, a19 in the first embodiment is carried out. Therefore, the same layer structure is obtained. FIG. 11A, d1 shows a state in which a $SiO_2$ film 30 constituting the uppermost layer has been subjected to dry etching to form a contact hole (FIG. 11A, d1).

Then, for forming multi-layer interconnection, a conductive electrode material is deposited to form a conductive layer 44. As the electrode material, a material generally used for forming a semiconductor integrated circuit is used. Specific examples include heavy metals, such as Al, W, Ti, Cu, Co, Mg, Pt, and Au; and alloys (silicides) of silicon and a metal, such as WSi, TiSi, and CoSi. Any materials other than these can be used as long as they are conductive. In the present embodiment, Al was deposited by sputtering (FIG. 11A, d2: Al sputtering).

Then, the unnecessary multi-layer interconnection material is removed by dry etching to form an electrode member (FIG. 11A, d3: electrode formation).

Then, a $SiO_2$ film 45 is deposited by a CVD method (FIG. 11A, d4: silicon dioxide CVD).

Next, a light-shielding layer 31 for shielding the TFT portion from light is deposited. As a material for the light-shielding layer, any material having properties of shielding light can be used. Specific examples include heavy metals, such as Al, W, Ti, Cu, and Co; and alloys (silicides) of silicon and a metal, such as WSi and TiSi. Any materials other than these can be used as long as they are light-shielding materials. In the present embodiment, Ti is deposited by sputtering (FIG. 11A, d5: BLK material sputtering).

Then, the unnecessary light-shielding material is removed by dry etching to form a light-shielding member (FIG. 11A, d6: BLK formation).

Then, a bonding agent is applied to the surface to form a bonding layer 32. Like in the step shown in FIG. 5C, a22 in the first embodiment, as a material for the bonding layer, a material having bonding properties is used. In the present embodiment, sol gel is used (FIG. 11A, d7: bonding agent application).

Then, a glass substrate 33 is bonded to the semiconductor device. In the present embodiment, after bonding, the resultant product is subjected to thermal annealing (FIG. 11B, d8: bonding to glass substrate).

After the semiconductor device is bonded and fixed to the glass substrate 33, the TFT portion is separated from the supporting substrate (silicon substrate 21) at a portion of the porous silicon 22 having a multi-layer structure. The separated semiconductor substrate (silicon substrate 21) is reused (FIG. 11B, d9: separation).

Then, the porous silicon 22 remaining on the separated surface is removed. In the removal of the porous silicon, etching with a mixture of hydrofluoric acid and nitric acid was performed using a spin etcher (FIG. 11B, d10: porous silicon removal).

Figure 11B:
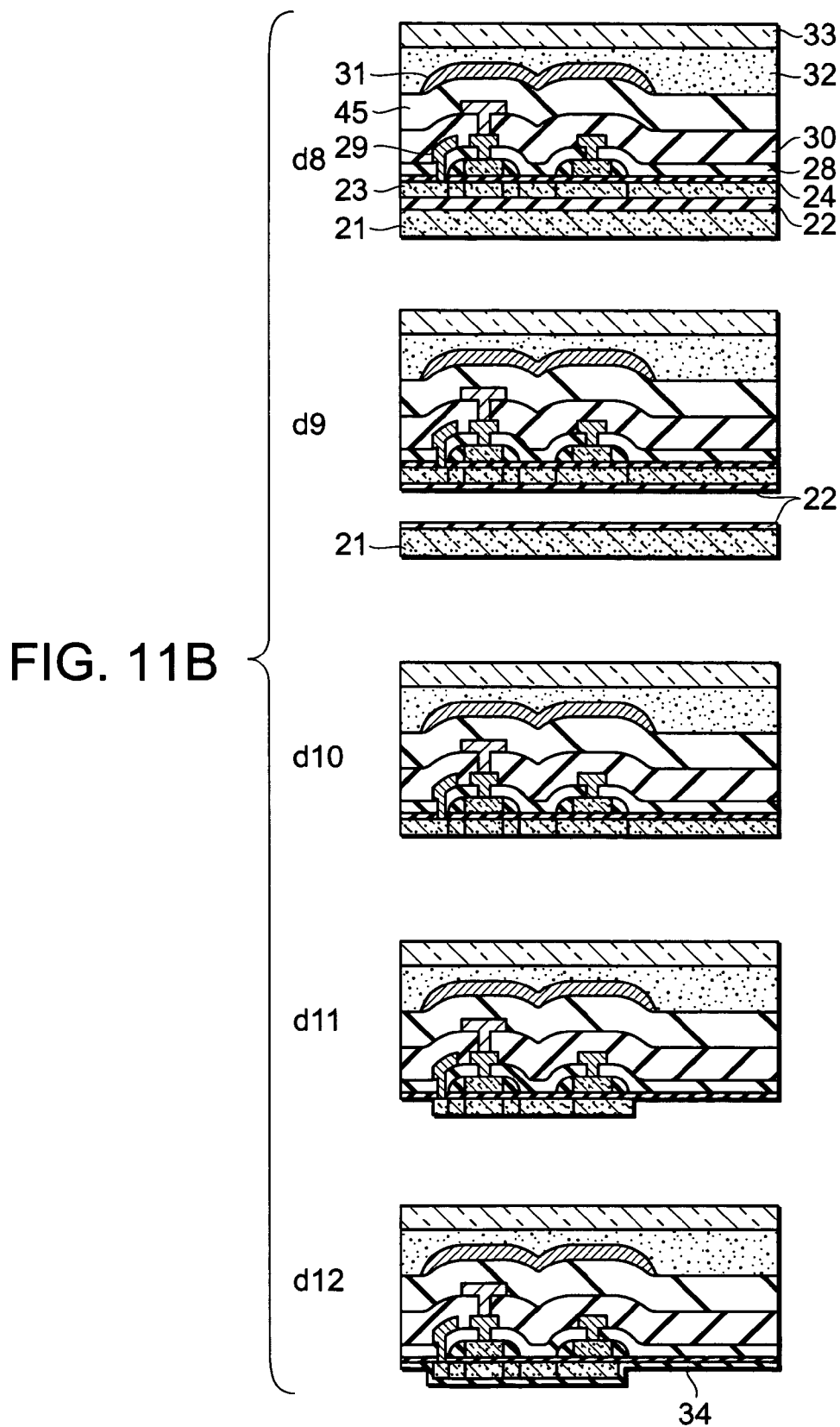

Then, the epitaxial Si layer 23 exposed through the separated surface is subjected to dry etching to form an SOI island (FIG. 11B, d11: SOI island formation).

Then, a $SiO_2$ film 34 is deposited by a CVD method. Like in the step shown in FIG. 7B, b13 in the second embodiment, the $SiO_2$ film 34 serves as both a gate oxide film for the back gate and an insulating material for the double-sided capacitor. When using a material having a high dielectric constant, the capacitance of the capacitor can be increased. In the present embodiment, as mentioned above, the $SiO_2$ film 34 was deposited by a CVD method (FIG. 11B, d12: silicon dioxide CVD).

Figure 11C:
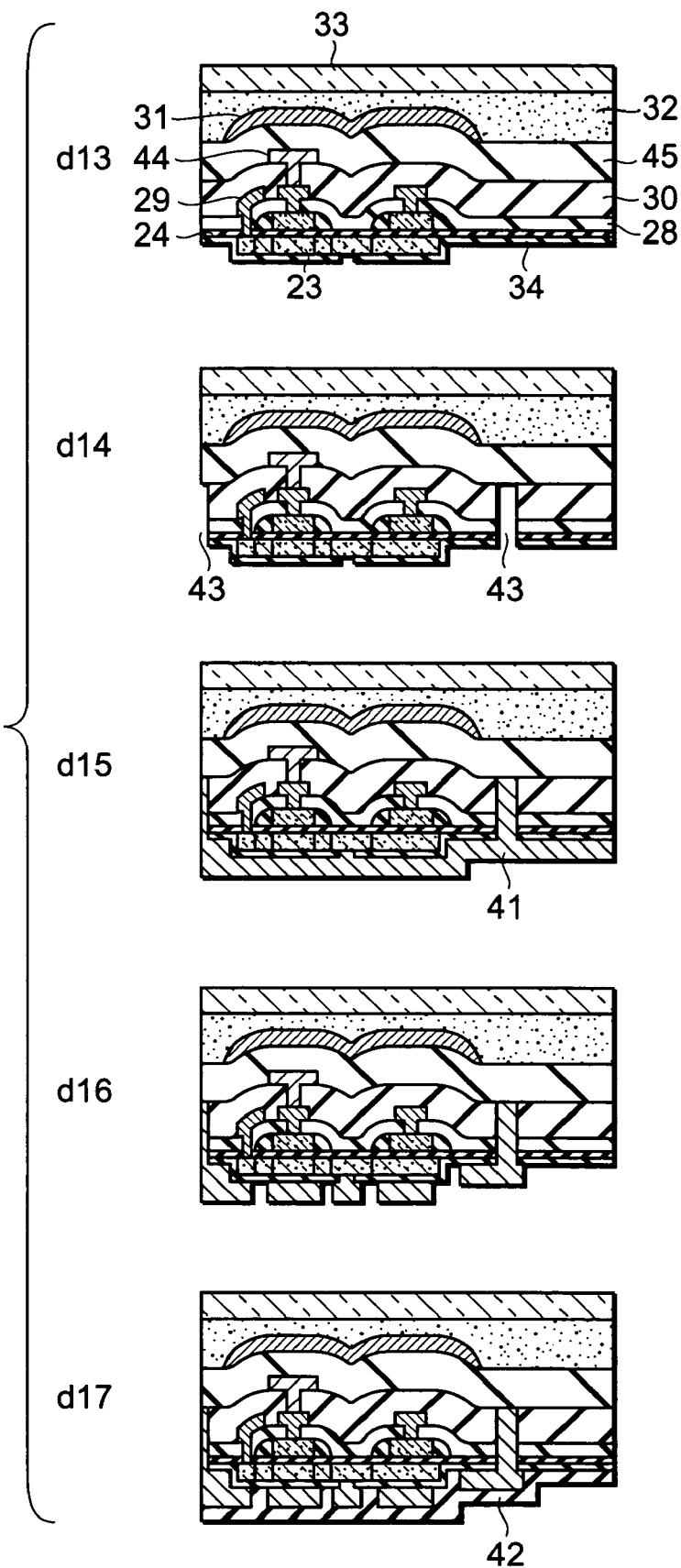

Then, for forming a contact hole, the $SiO_2$ film 34 is subjected to dry etching (FIG. 11C, d13: contact hole formation).

Then, the $SiO_2$ film 34 is subjected to dry etching for the outer periphery portion of the TFT in the same manner as in the third embodiment to form trenches 43 so as to shield the side regions of the TFT from light (FIG. 11C, d14: formation of hole for side light-shielding plate).

Next, a conductive layer 41 is deposited wherein the conductive layer 41 serves as a conductive electrode material for the back gate and the double-sided capacitor. As the electrode material, a conductive material generally used for forming a semiconductor integrated circuit can be used. In this case, it is preferred to use a material and a deposition method which can completely fill the trenches 43. Specific examples of materials include heavy metals, such as Al, W, Ti, Cu, Co, Mg, Pt, and Au; and alloys of Si and a metal, such as WSi and TiSi. Any materials other than these can be used as long as they are conductive. In the present embodiment, WSi was deposited by a CVD method. The conductive layer 41 is used for junction wiring to the transparent electrode in the subsequent step (FIG. 11C, d15: BLK member sputtering).

Then, the unnecessary electrode material is removed by dry etching to form an electrode member. This electrode member serves also as a light-shielding layer which shields light in the vertical and horizontal directions as viewed in the figures (FIG. 11C, d16: BLK formation).

Then, a $SiO_2$ film 42 is deposited by a CVD method (FIG. 11C, d17: silicon dioxide CVD).

Figure 11D:
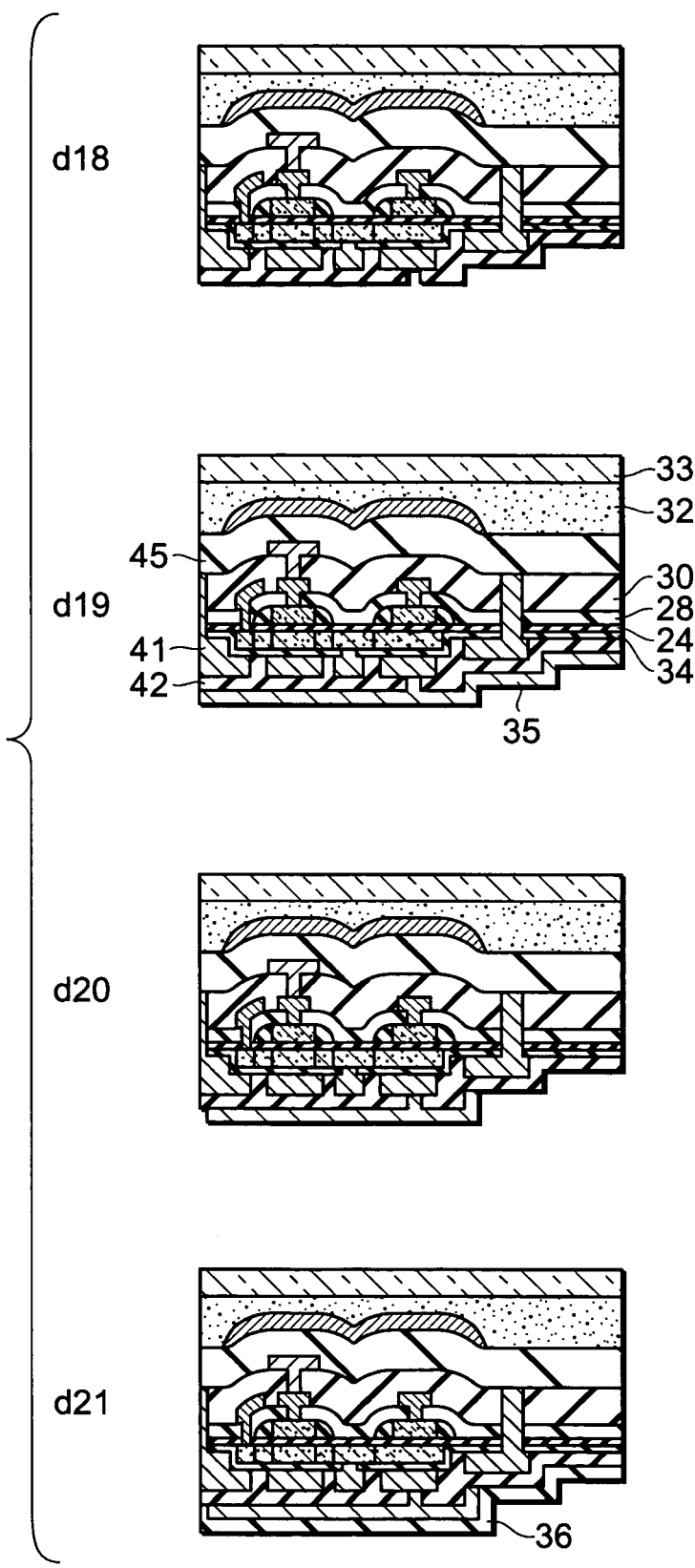

Then, for forming a contact hole, the $SiO_2$ film 42 is subjected to dry etching (FIG. 11D, d18: contact hole formation).

Then, a light-shielding layer 35 for shielding the TFT portion from light is deposited. The light-shielding layer 35 is used for junction wiring to the transparent electrode in the subsequent step. As a material for the light-shielding layer, any material having properties of shielding light can be used. Specific examples include heavy metals, such as Al, W, Ti, Cu, and Co; and alloys of silicon and a metal, such as WSi and TiSi. Any materials other than these can be used as long as they are light-shielding materials. In the present embodiment, titanium silicide (TiSi) was deposited by a CVD method (FIG. 11D, d19: BLK member sputtering).

Then, the unnecessary light-shielding layer 35 is removed by dry etching to form a light-shielding member (FIG. 11D, d20: BLK formation).

Then, a $SiO_2$ film 36 is deposited by a CVD method (FIG. 11D, d21: silicon dioxide CVD).

Then, for forming a contact hole, the $SiO_2$ film 36 is subjected to dry etching. The contact hole is formed so as to achieve electrical conduction between the transparent electrode and the drain portion (FIG. 11E, d22: contact hole formation).

Next, a transparent electrode layer 37 is deposited. As the electrode material, like in the step shown in FIG. 5F, a33 in the first embodiment, a general transparent electrode material is used. In the present embodiment, ITO is deposited by sputtering (FIG. 11E, d23: ITO sputtering).

Then, the unnecessary transparent electrode material is removed by etching to form a transparent electrode member (FIG. 11E, d24: transparent electrode formation).

Figure 11F:
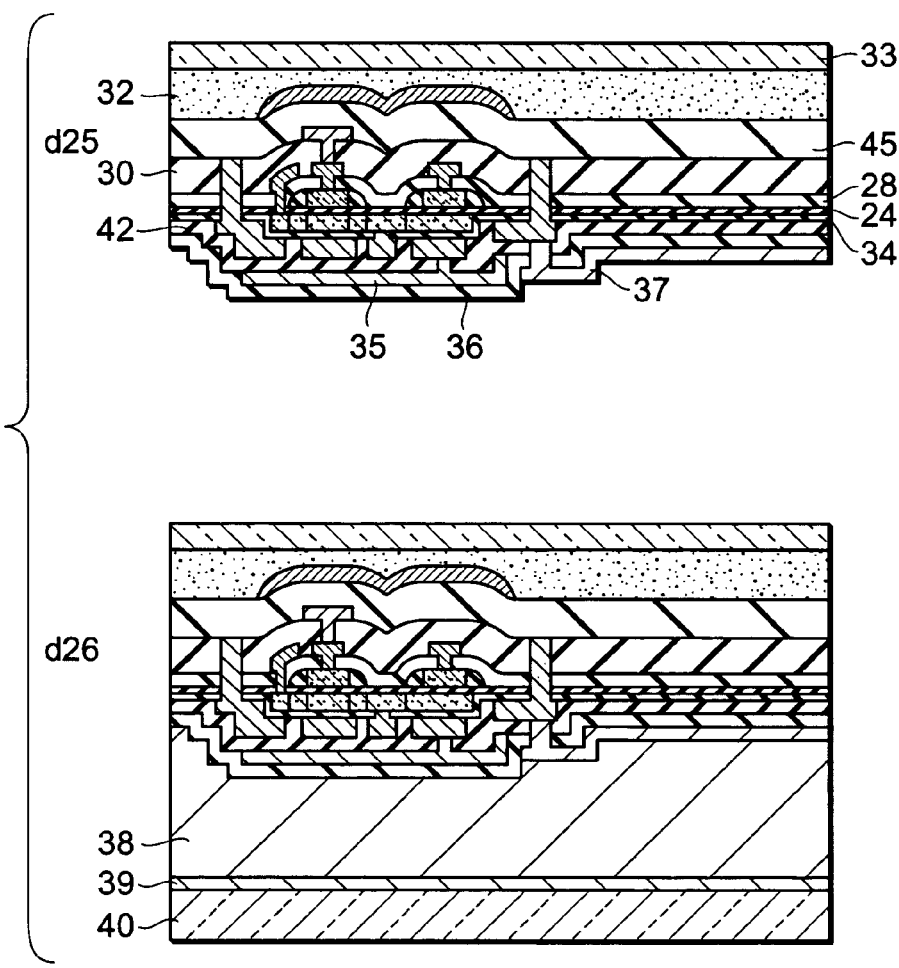

Thus, a TFT unit (member) is completed (FIG. 11F, d25: TFT completion).

Figure 12:
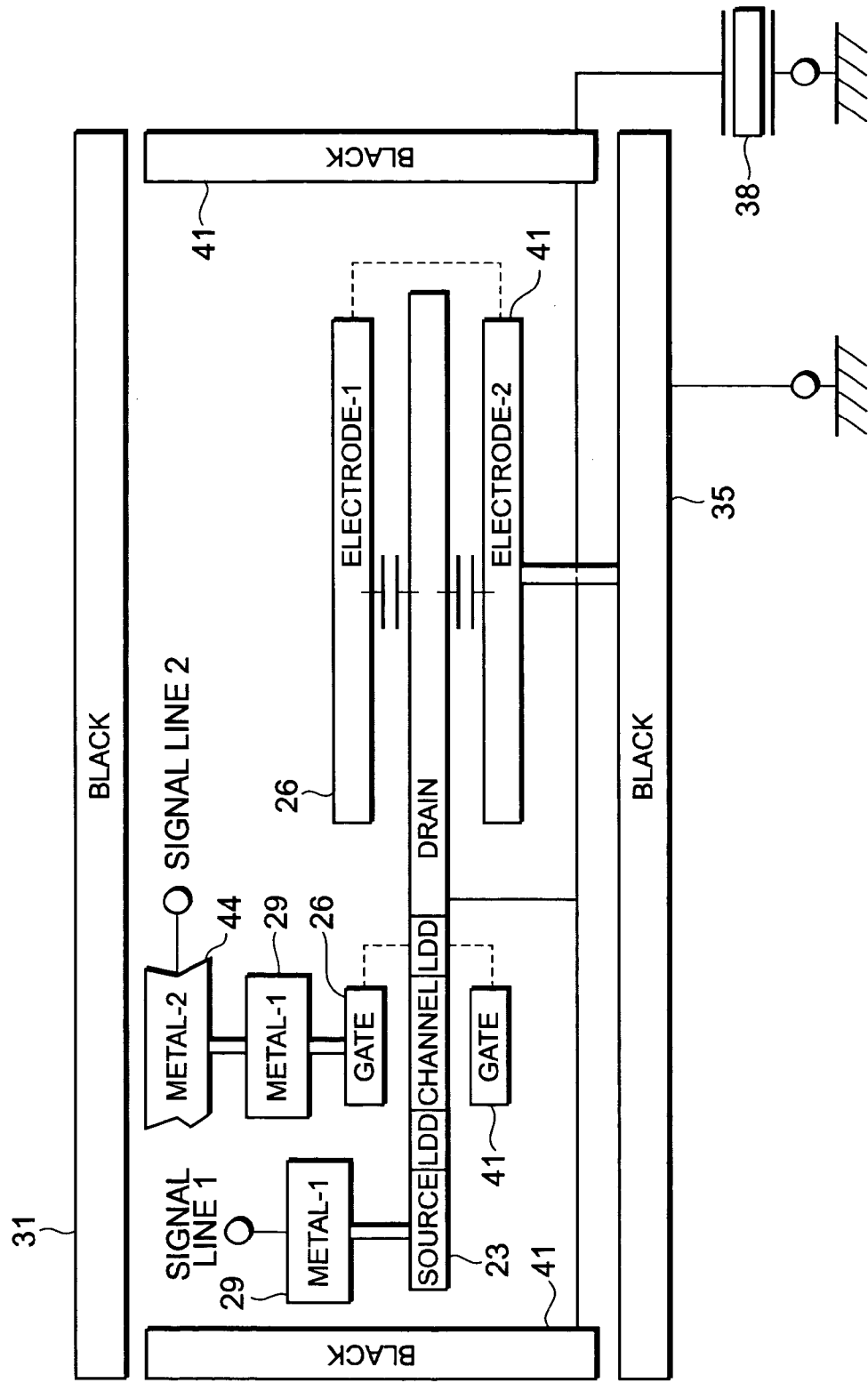
FIG. 12 is a view showing the diagrammatic cross-sectional structure of a liquid crystal display produced in the fourth embodiment.

Further, the TFT and a glass substrate 40 having thereon a counter electrode 39 are arranged so that the electrode 39 faces the TFT, and a space between them is filled with a liquid crystal material 38 to complete a liquid crystal display (FIG. 11F, d26: LCD panel completion). FIG. 12 shows a diagrammatic cross-sectional structure of the liquid crystal display produced in the present embodiment.

(5) Fifth Embodiment

Figure 13A:
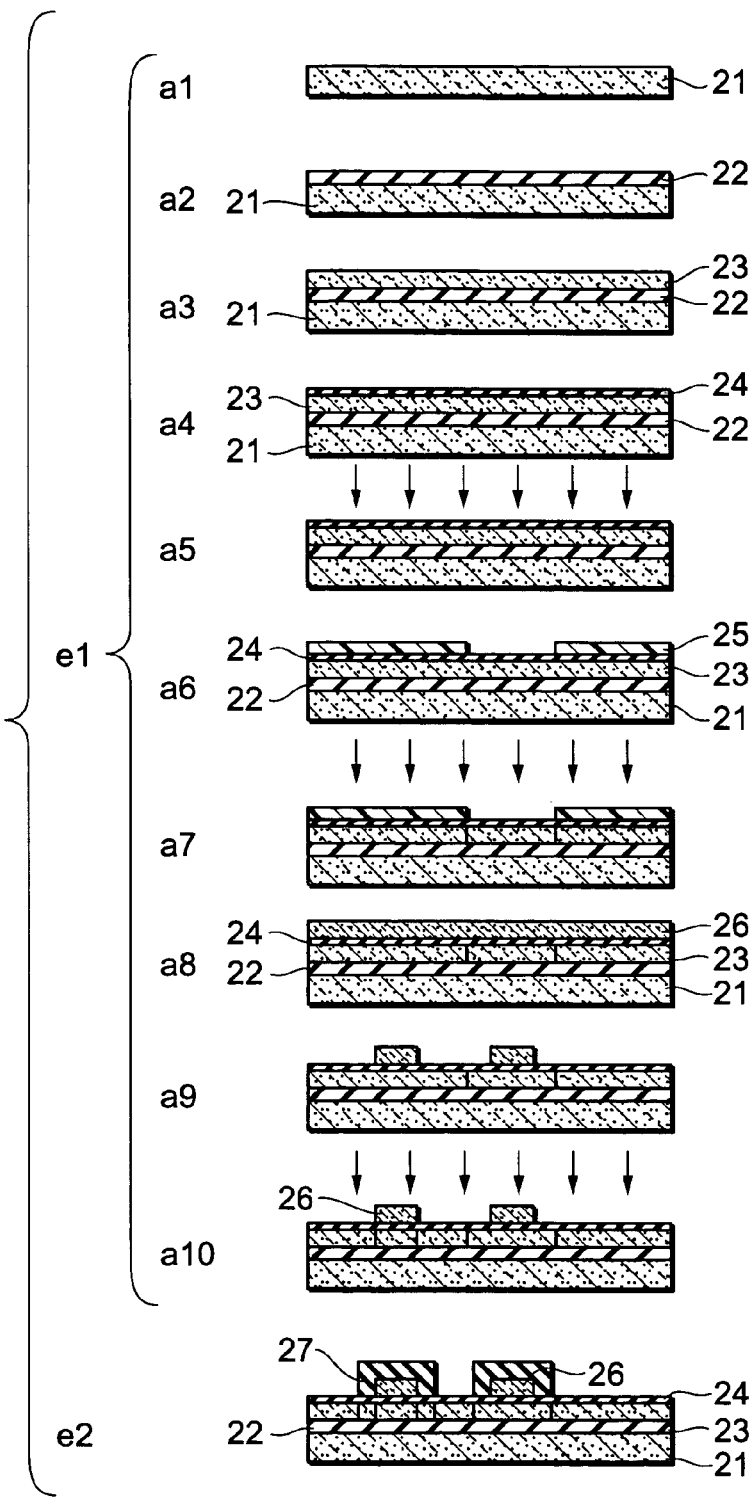
FIGS. 13A to 13C are views showing a fabrication process according to the fifth embodiment.

In the present embodiment, another process for producing a liquid crystal display having a double gate transistor, a double-sided capacitor, and a complete (four-side) light-shielding plate (having no sidewall) is described. In FIGS. 13A, e1 to 13C, e5 and the drawings used for describing the other embodiments above, like parts or portions are indicated by like reference numerals.

A process comprising the steps shown in FIG. 5A, a1 through a10 in the first embodiment is carried out. In this stage, a layer structure in which a $SiO_2$ film 27 is deposited on the upper surface of the polysilicon layer 26 processed into an electrode member by dry etching is obtained (FIG. 13A, e1).

Then, dry etching is conducted according to the resist pattern. The resist pattern is formed so that an LDD structure is formed (FIG. 13A, e2: resist pattern formation).

Figure 13B:
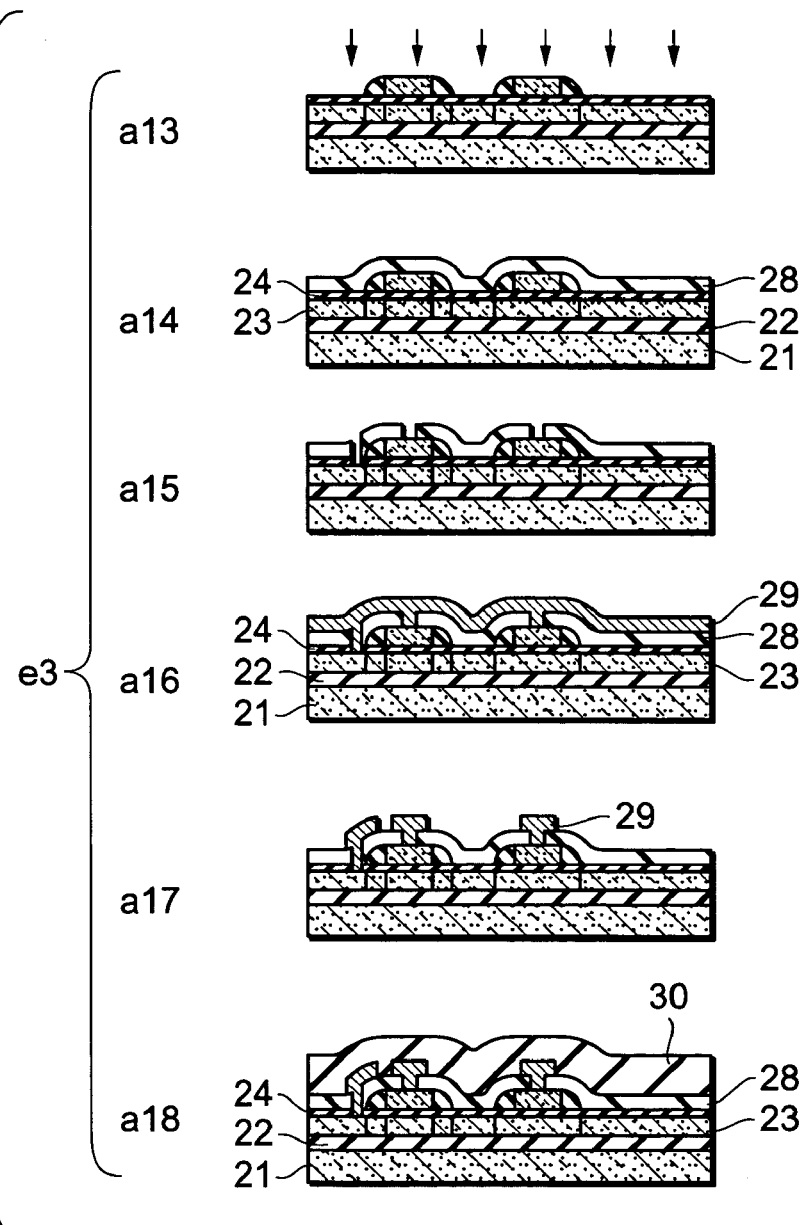

Then, a process comprising the steps shown in FIGS. 5B, a13 through a18 in the first embodiment is carried out. Specifically, the step for forming source-drain regions by ion implantation, the step for forming a contact hole, the step for forming an electrode, and the like are carried out (FIG. 13B, e3).

Figure 13C:
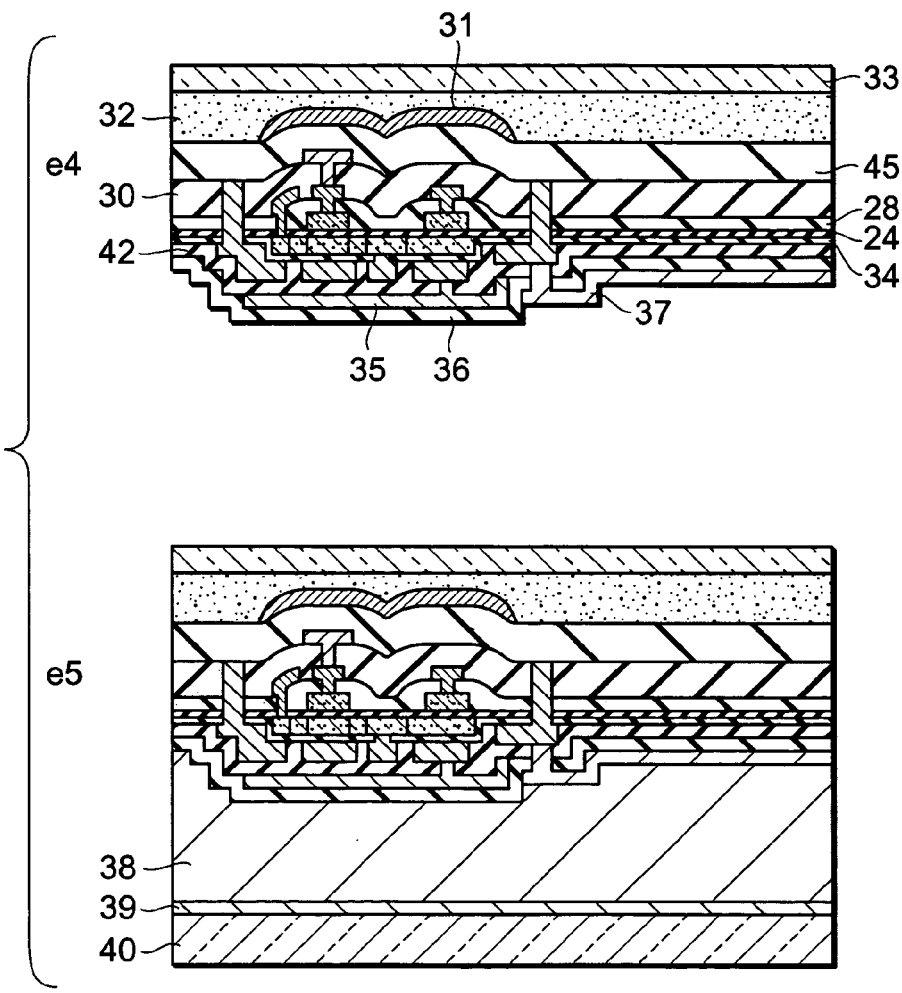

Then, a process comprising the steps shown in FIGS. 11A, d1 through 11F, d25 in the fourth embodiment is carried out. Specifically, the step for forming a multi-layer interconnection electrode, the step for forming a light-shielding layer, the step for bonding to the glass substrate and separation from the silicon substrate 21, and other steps are successively carried out, thus completing a TFT unit (FIG. 13C, e4: TFT unit completion).

Further, the TFT and a glass substrate 40 having thereon a counter electrode 39 are arranged so that the electrode 39 faces the TFT, and a space between them is filled with a liquid crystal material 38 to complete a liquid crystal display. The resultant structure is the same as the cross-sectional structure shown in FIG. 12 (FIG. 13C, e5: LCD panel completion).

(6) Sixth Embodiment

Figure 14:
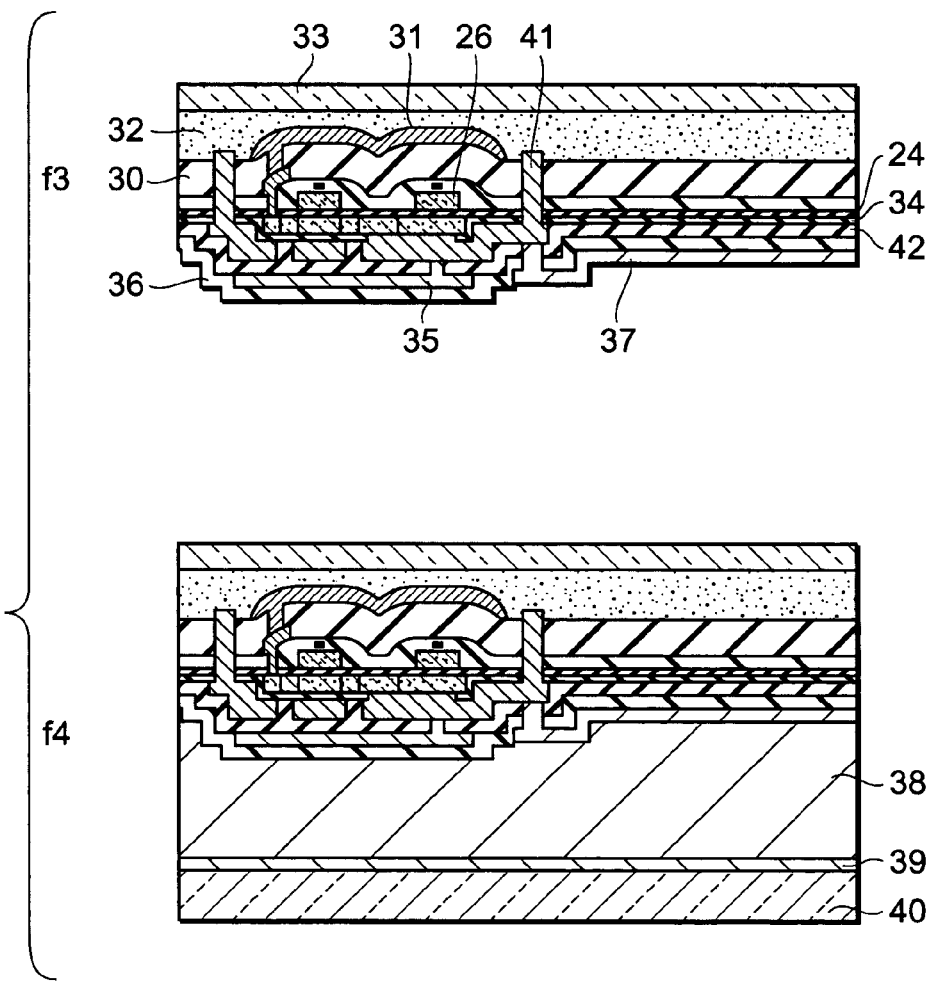
FIG. 14 is a view showing a fabrication process according to the sixth embodiment.

In the present embodiment, a process for producing a liquid crystal display having a double gate transistor, a double-sided capacitor, and a complete (four-side) light-shielding plate is described. In the present embodiment, the polysilicon gate is used as wiring. In FIG. 14 and the drawings used for describing the other embodiments above, like parts or portions are indicated by like reference numerals.

A process comprising the steps shown in FIGS. 5A, a1 through 5B, a18 in the first embodiment is carried out. Here, no contact hole is formed in the upper portion of the gate electrode. A contact hole is formed only in the source portion.

Then, the step shown in FIG. 5B, a19 in the first embodiment is skipped, and a process comprising the steps shown in FIGS. 5B, a20 through 5D, a27 is carried out. Specifically, the step for stacking the light-shielding layer 31, the step for bonding to the glass substrate and separation from the silicon substrate 21, the step for forming an SOI island, and other steps are successively carried out.

Next, a process comprising the steps shown in FIGS. 11C, d13 through 11F, d25 in the fourth embodiment is carried out. Specifically, the procedure up to completion of the TFT unit is conducted.

Figure 15:
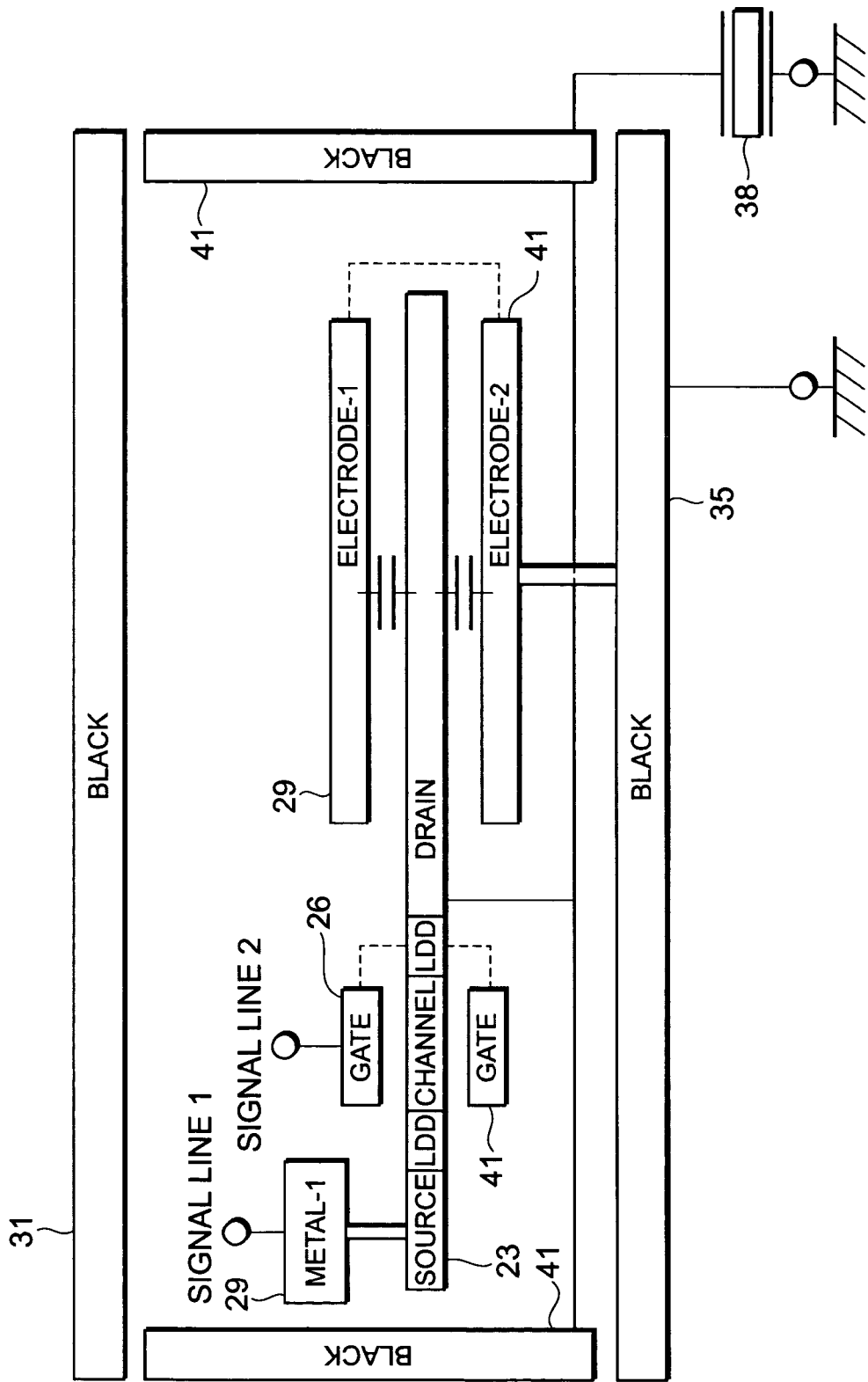
FIG. 15 is a view showing the diagrammatic cross-sectional structure of a liquid crystal display produced in the sixth embodiment.

Further, the TFT and a glass substrate 40 having thereon a counter electrode 39 are arranged so that the electrode 39 faces the TFT, and a space between them is filled with a liquid crystal material 38 to complete a liquid crystal display (FIG. 14, f4: LCD panel completion). The resultant structure is the same as the cross-sectional structure shown in FIG. 15.

(7) Seventh Embodiment

Figure 16:
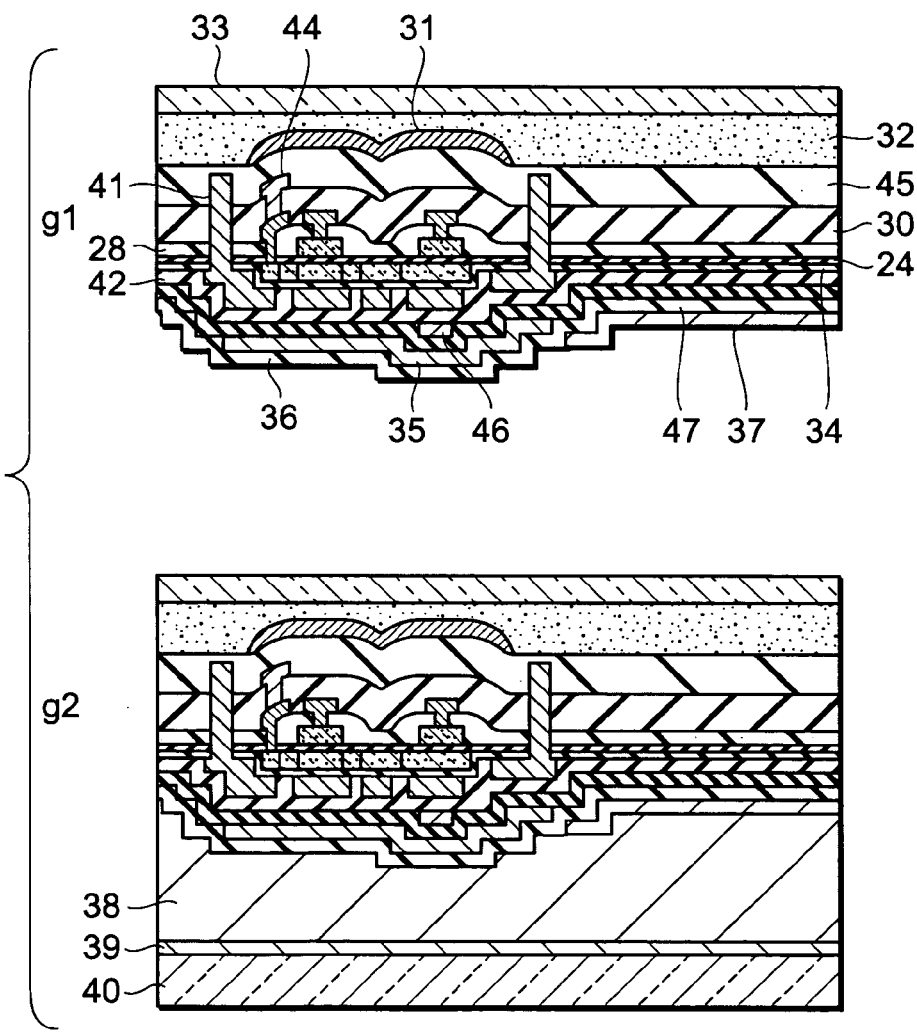
FIG. 16 is a view showing a fabrication process according to the seventh embodiment.
Figure 17:
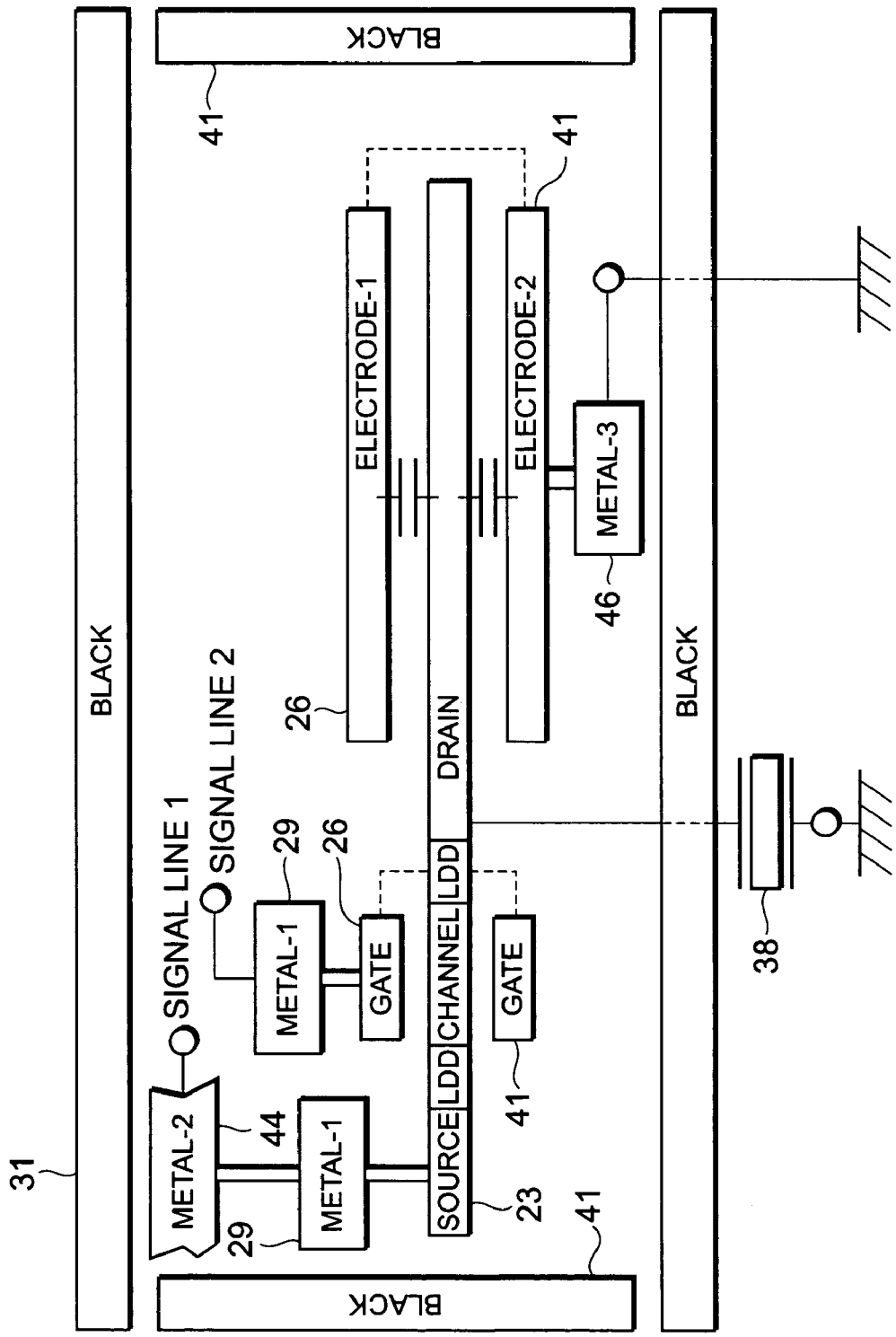
FIG. 17 is a view showing the diagrammatic cross-sectional structure of a liquid crystal display produced in the seventh embodiment.

In the present embodiment, a variation of the fourth embodiment described above is described. FIG. 16, g1 and g2, shows an example of the layer structure of a TFT unit and an example of the layer structure of the liquid crystal display completed. In addition, FIG. 17 shows a diagrammatic cross-sectional structure. In FIG. 16, g1 and g2, and the drawings used for describing the other embodiments above, like parts or portions are indicated by like reference numerals.

A difference between the layer structure shown in FIG. 16, g1 and g2, and the fourth embodiment resides in that the source electrode is comprised of a multi-layer electrode 44 and the gate electrode is comprised of a single layer. Another difference resides in that an electrode member (metal material) 46 for the double-sided capacitor is formed and an insulating layer 47 is formed between the electrode member 46 and the light-shielding layer 35.

(8) Eighth Embodiment

Figure 18:
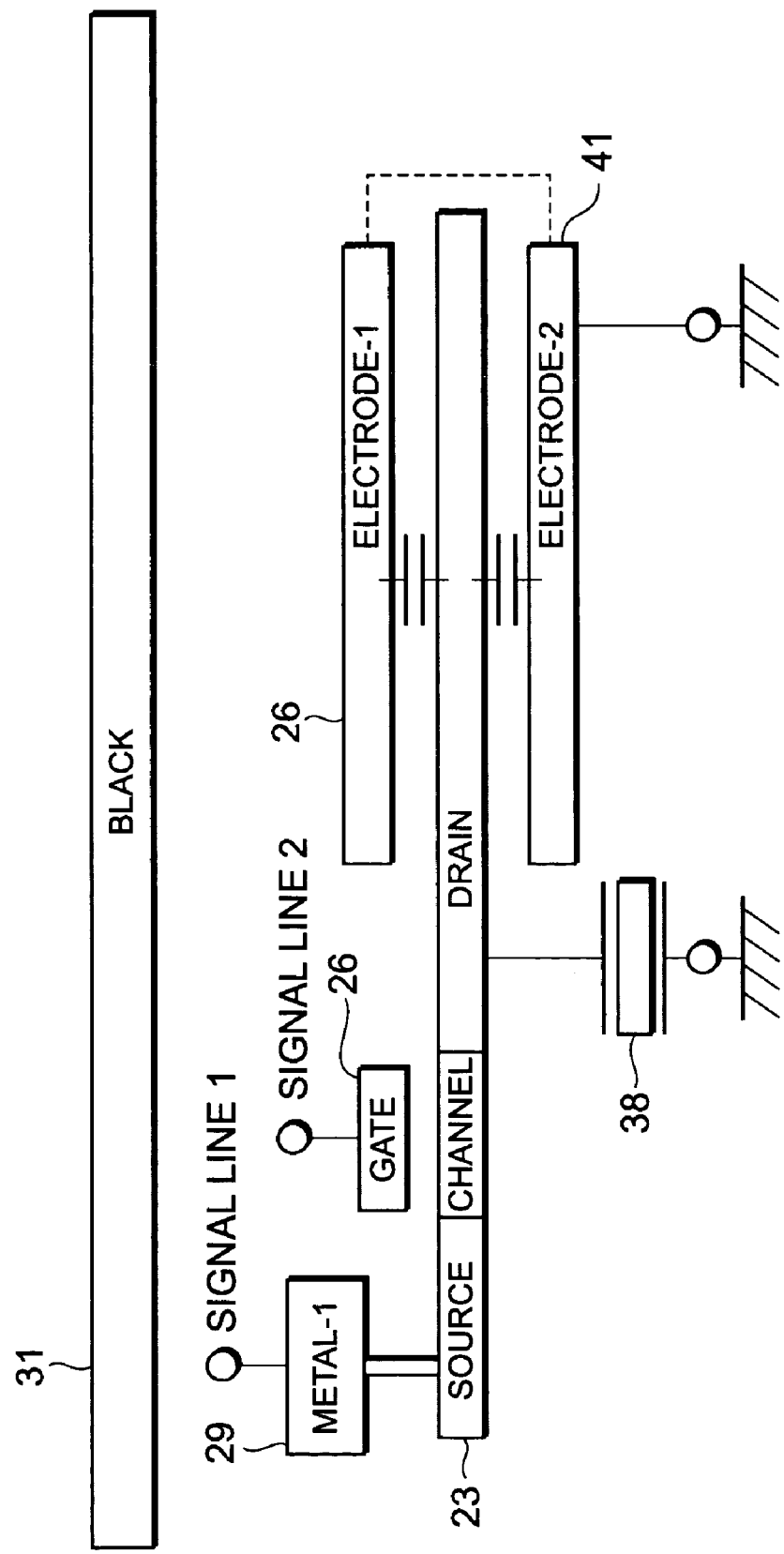
FIG. 18 is a view showing the diagrammatic cross-sectional structure of a liquid crystal display produced in the eighth embodiment.

In the present embodiment, a variation obtained by a combination of the first embodiment and second embodiment described above is described. Specifically, in the present embodiment, an example of the structure of a liquid crystal display having a single gate transistor (having no LDD), a double-sided capacitor, and a light-shielding plate on one side is shown. FIG. 18 shows a diagrammatic cross-sectional structure of the liquid crystal display produced. In FIG. 18 and the drawings used for describing the other embodiments above, like parts or portions are indicated by like reference numerals.

The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A thin film semiconductor device, comprising:
    a semiconductor layer having a channel region between a source region and a drain region;
    a first insulating film on a first surface of said semiconductor layer;
    a gate electrode on said first insulating film, said first insulating film being between said channel region and said gate electrode;
    a first electrode on said first insulating film, said first insulating film being between said drain region and said first electrode;
    a second insulating film on a second surface of said semiconductor layer, said second surface being opposite said first surface, said second insulating film being in contact with said first insulating film; and
    a light-shielding layer between said second insulating film and a third insulating film, said third insulating film being between said second insulating film and a transparent electrode.

2. A thin film semiconductor device according to claim 1, wherein a conductive material on said second surface, said drain region being between said first electrode and said conductive material.

3. A thin film semiconductor device according to claim 1, wherein a back gate on said second insulating film, said second insulating film being between said channel region and said back gate.

4. A thin film semiconductor device according to claim 1, wherein said semiconductor layer has a thickness of several hundred angstroms to about 1 μm.

5. A thin film semiconductor device according to claim 1, wherein a MIS transistor includes said gate electrode, said channel region, said source region and said drain region.

6. A thin film semiconductor device according to claim 1, wherein said conductive material is in electrical contact with said drain region.

7. A thin film semiconductor device according to claim 1, further comprising:
    a second electrode on said second insulating film, said second insulating film being between said drain region and said second electrode.

8. A liquid crystal display, comprising:
    the thin film semiconductor device according to claim 1;
    a liquid crystal material, at least a portion of said second insulating film being between said second surface and said liquid crystal material.

9. A liquid crystal display according to claim 8, further comprising:
    said transparent electrode between said second insulating film and said liquid crystal material.

10. A liquid crystal display according to claim 8, further comprising:
    a counter electrode between a substrate and said liquid crystal material.

* * * * *